United States Patent
Chung et al.

(10) Patent No.: US 12,389,660 B1
(45) Date of Patent: Aug. 12, 2025

(54) SEMICONDUCTOR DEVICE INCLUDING BACKSIDE CONTACT STRUCTURE WITH SILICIDE LAYER FORMED IN FEOL PROCESS

(71) Applicant: SAMSUNG ELECTRONICS CO., LTD., Suwon-si (KR)

(72) Inventors: Wonkeun Chung, Clifton Park, NY (US); Byounghoon Kim, Rexford, NY (US); Jongjin Lee, Clifton Park, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/808,758

(22) Filed: Aug. 19, 2024

Related U.S. Application Data

(60) Provisional application No. 63/631,803, filed on Apr. 9, 2024.

(51) Int. Cl.
*H10D 30/67* (2025.01)
*H01L 21/283* (2006.01)
*H10D 62/10* (2025.01)
*H10D 64/66* (2025.01)
*H10D 30/01* (2025.01)
*H10D 30/43* (2025.01)

(52) U.S. Cl.
CPC ......... *H10D 64/668* (2025.01); *H01L 21/283* (2013.01); *H10D 30/6729* (2025.01); *H10D 62/116* (2025.01); *H10D 30/014* (2025.01); *H10D 30/43* (2025.01); *H10D 30/6735* (2025.01); *H10D 30/6757* (2025.01); *H10D 62/121* (2025.01)

(58) Field of Classification Search
CPC ............... H10D 64/668; H10D 84/013; H10D 30/6729; H10D 84/0149; H10D 62/116; H01L 29/41766; H01L 23/5286; H01L 29/4975; H01L 21/283; H01L 29/0653; H01L 29/41733; H01L 29/66439; H01L 29/775; H01L 29/78696; H01L 23/481
See application file for complete search history.

(56) References Cited

U.S. PATENT DOCUMENTS

| | | | |
|---|---|---|---|
| 11,588,050 B2 | 2/2023 | Yu et al. | |
| 2022/0216340 A1* | 7/2022 | Lin | ............ H01L 29/7855 |
| 2024/0030136 A1 | 1/2024 | Chang et al. | |
| 2024/0072047 A1 | 2/2024 | Xie et al. | |
| 2024/0105609 A1 | 3/2024 | Wu et al. | |
| 2024/0105615 A1 | 3/2024 | Lee et al. | |
| 2024/0105799 A1 | 3/2024 | Xie et al. | |
| 2024/0421085 A1* | 12/2024 | Kang | ............ H01L 21/283 |
| 2024/0429284 A1* | 12/2024 | Xie | ............ H10D 30/43 |

* cited by examiner

*Primary Examiner* — Suberr L Chi
(74) *Attorney, Agent, or Firm* — Sughrue Mion, PLLC

(57) ABSTRACT

Provided is a semiconductor device including backside contact structure with a silicide layer formed in an FEOL process, and a method of manufacturing the same. The method includes: forming a channel structure on a substrate; forming a placeholder structure in the substrate; forming a silicide layer on the placeholder structure; forming a source/drain region on the silicide layer based on the channel structure; forming a gate structure on the channel structure; and forming a backside contact structure on a bottom surface of the placeholder structure.

14 Claims, 23 Drawing Sheets

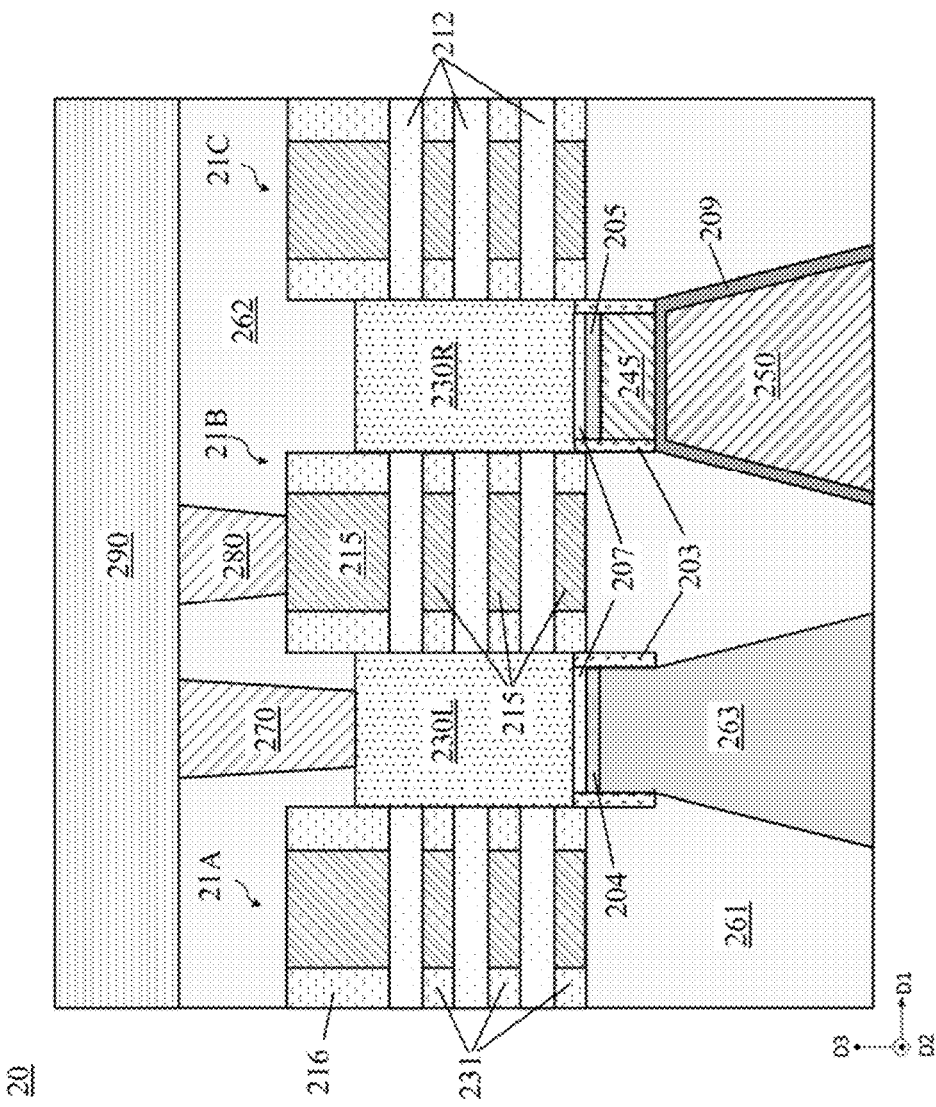

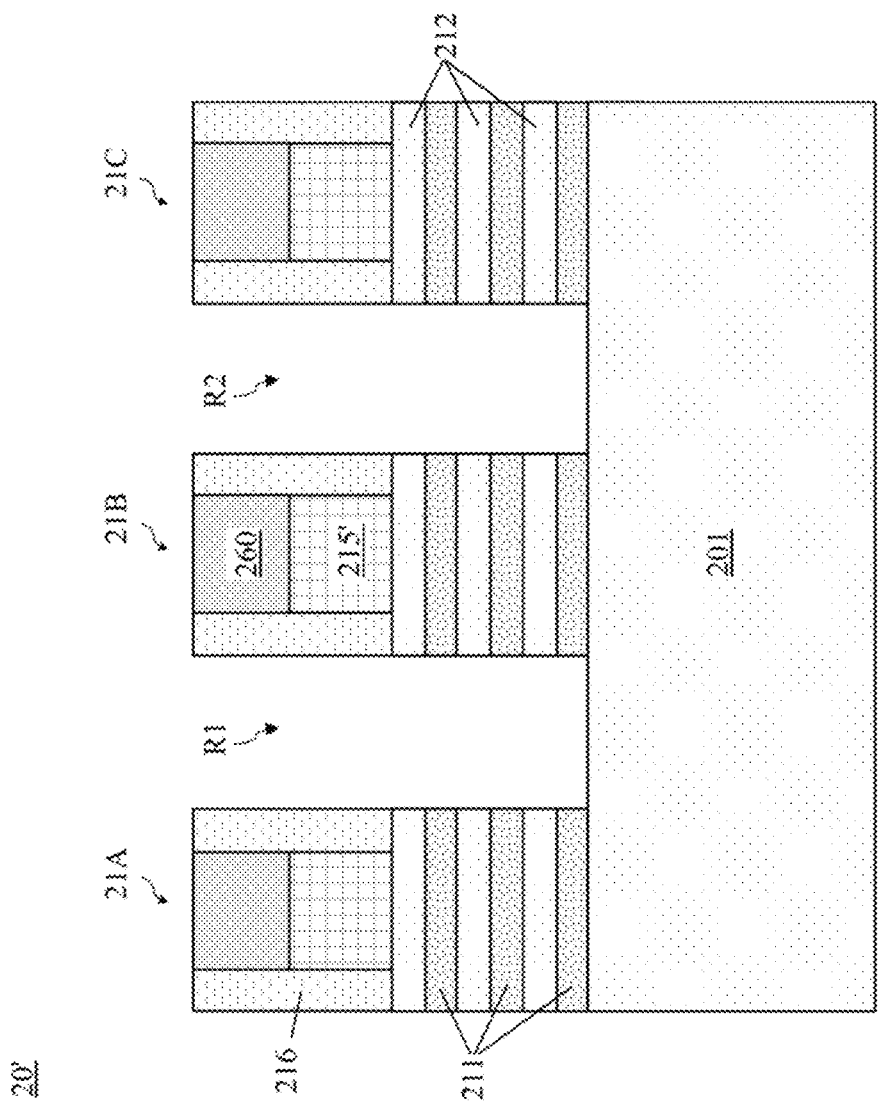

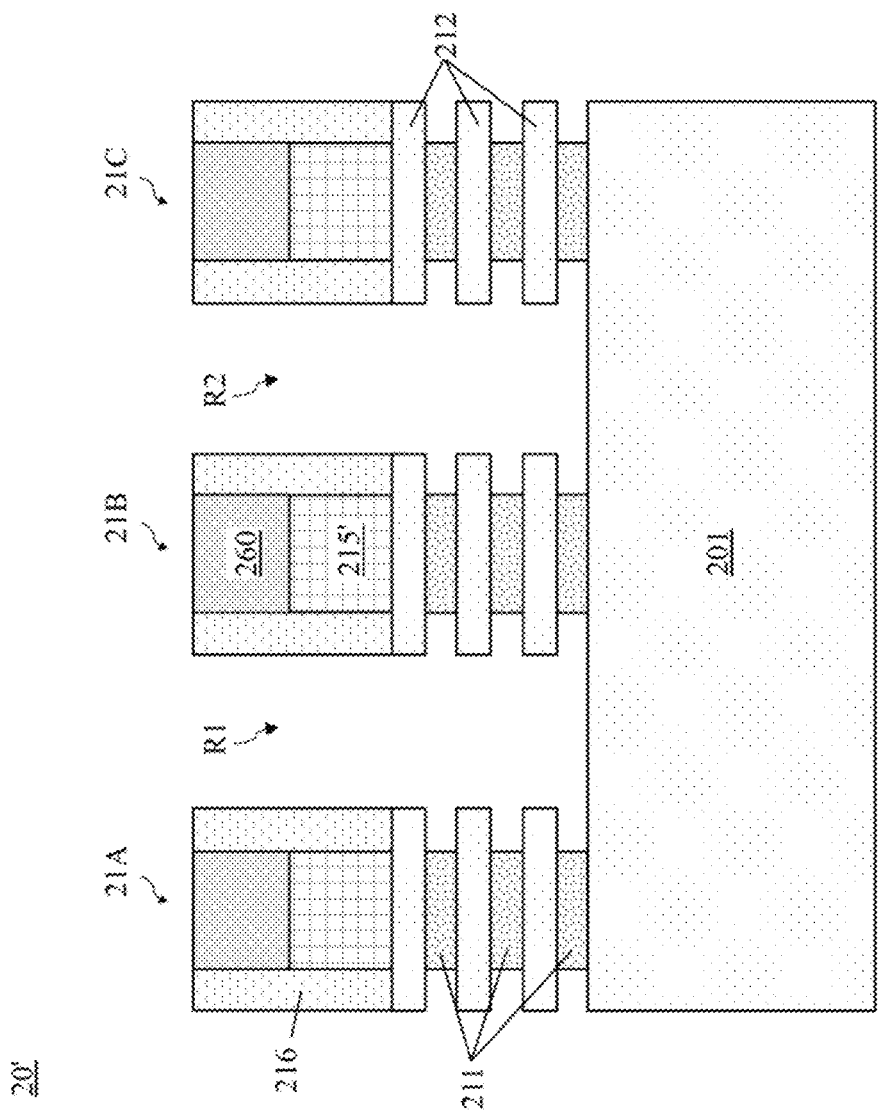

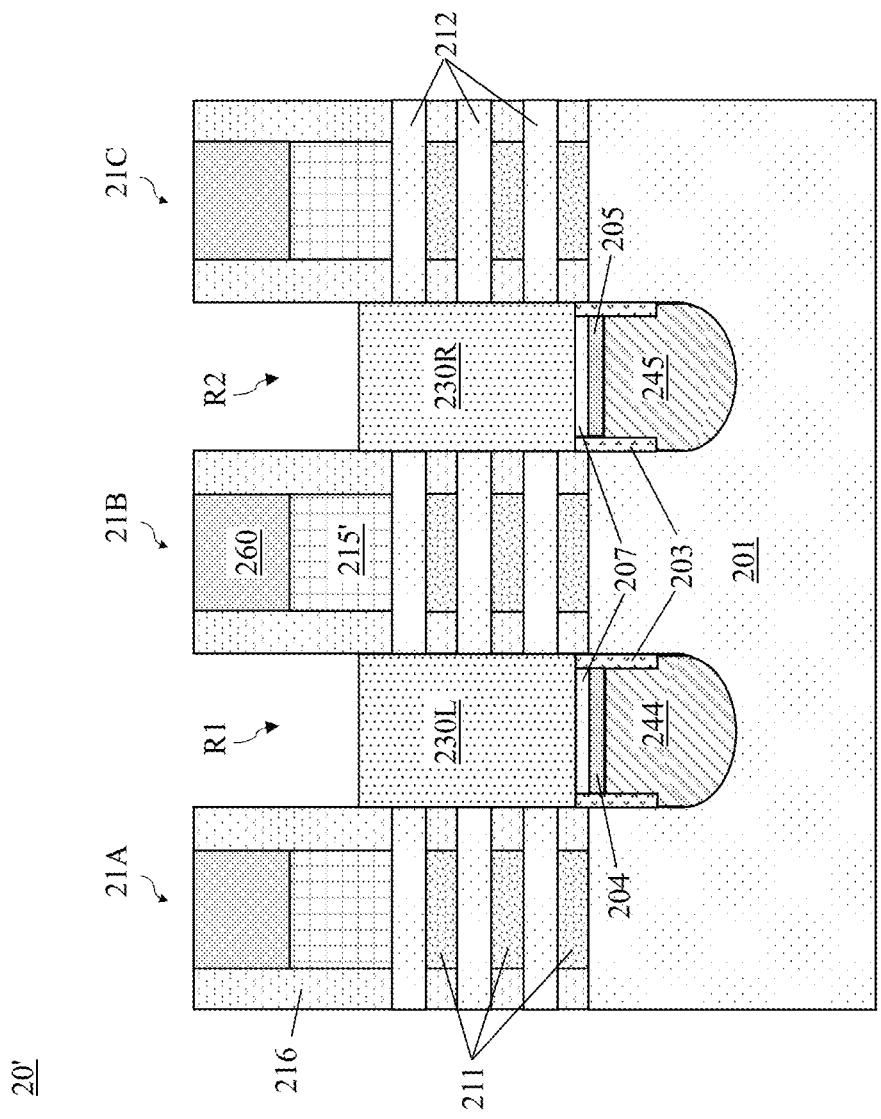

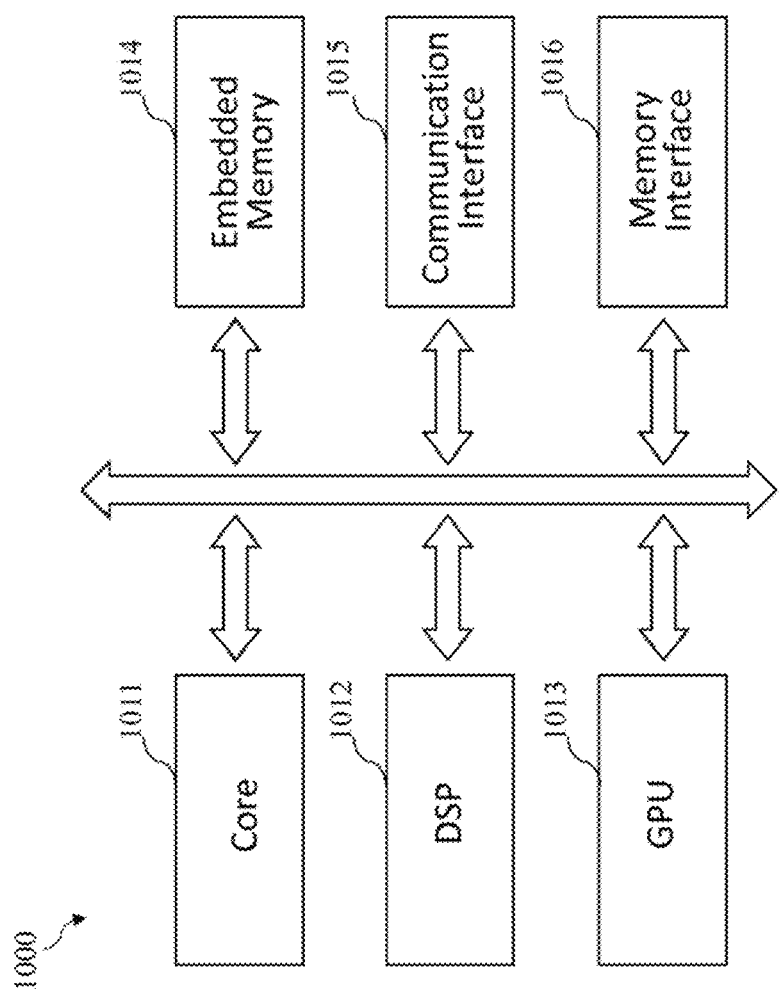

SEMICONDUCTOR DEVICE INCLUDING BACKSIDE CONTACT STRUCTURE WITH SILICIDE LAYER FORMED IN FEOL PROCESS

CROSS-REFERENCE TO RELATED APPLICATION

This application is based on and claims priority from U.S. Provisional Application No. 63/631,803 filed on Apr. 9, 2024 in the U.S. Patent and Trademark Office, the disclosure of which is incorporated herein in its entirety by reference.

BACKGROUND

1. Field

Apparatuses and methods consistent with example embodiments of the disclosure relate to a semiconductor device including a backside contact structure with a silicide layer thereon which is formed in a front-end-of-line (FEOL) process.

2. Description of Related Art

Growing demand for an integrated circuit having a high device density and performance has introduced a field-effect transistor such as fin field-effect transistor (FinFET), a nanosheet transistor, a forksheet transistor, or many other types of field-effect transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, multi-bridge channel field-effect transistor (MBCFET). The forksheet transistor takes a form of a combination of two nanosheet transistors with an isolation wall therebetween as an insulation backbone. Nanosheet channel layers of each nanosheet transistor in the forksheet transistor may be formed at each side of the isolation wall and pass through a gate structure of the nanosheet transistor at each side of the isolation wall.

Further, a backside power distribution network (BSPDN) structure formed at a back side of a field-effect transistor structure has been introduced to address a routing complexity and excessive IR drop at a front side of the field-effect transistor structure, thereby to achieve high power delivery performance, and further, standard cell height scaling. The BSPDN structure may include a backside metal line and a backside contact structure (or backside contact plug) through which a positive or negative voltage may be supplied to a source/drain region of the field-effect transistor. The backside contact structure may also be used to connect the source/drain region of the field-effect transistor to another circuit element. Among various proposed schemes, a direct backside contact (DBC) structure formed on a bottom surface of a source/drain region is known as the most efficient and the highest-performance contact structure.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides a semiconductor device in which a silicide layer is formed on a metal placeholder structure in a front-end-of-line (FEOL) process at a temperature of on or above 900° C. without a risk of melting of a back-end-of-line (BEOL) structure According to an embodiment, there is provided a semiconductor device which may include: a placeholder structure; a silicide layer on a top surface of the placeholder structure; a source/drain region on the silicide layer; and a backside contact structure on a bottom surface of the placeholder structure.

According to an embodiment, there is provided a semiconductor device which may include: a source/drain region; a silicide layer on a bottom surface of the source/drain region; a supplemental isolation structure below the silicide layer; and a backside isolation structure surrounding the supplemental isolation structure.

According to embodiments, there is provided a method of manufacturing a semiconductor device. The method may include: forming a channel structure on a substrate; forming a placeholder structure in the substrate; forming a silicide layer on the placeholder structure; forming a source/drain region on the silicide layer based on the channel structure; forming a gate structure on the channel structure; and forming a backside contact structure on a bottom surface of the placeholder structure.

BRIEF DESCRIPTION OF DRAWINGS

Example embodiments of the disclosure will be more clearly understood from the following detailed description taken in conjunction with the accompanying drawings in which:

FIG. 2 illustrates a semiconductor device including a backside contact structure with a silicide layer formed in an FEOL process, according to one or more embodiments;

FIG. 5 is a schematic block diagram illustrating an electronic device including a semiconductor device including a backside contact structure with a silicide layer formed in an FEOL process, according to one or more embodiments.

DETAILED DESCRIPTION

Figure 1A:
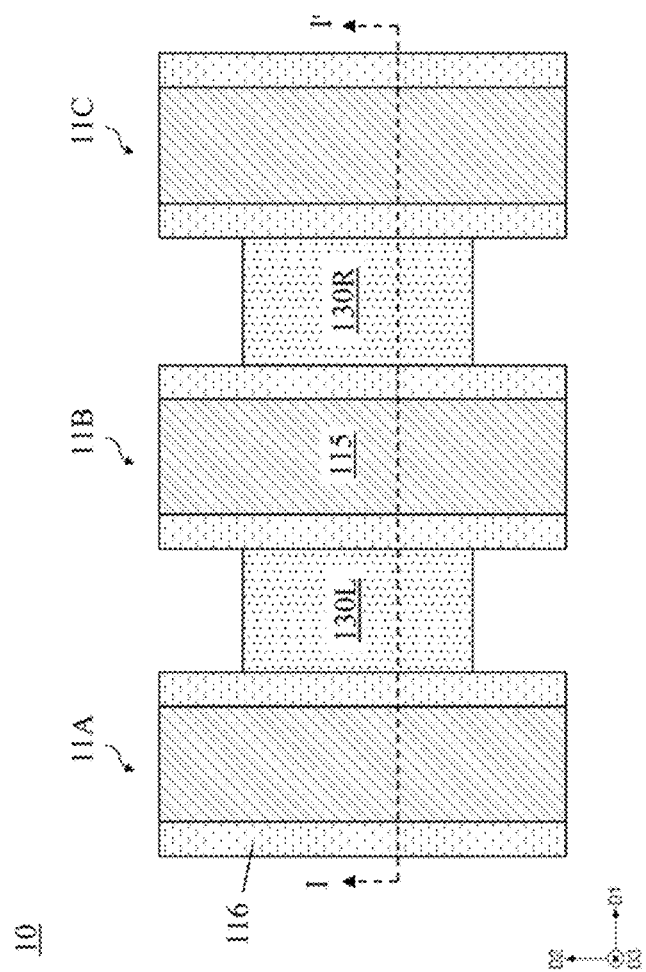
FIGS. 1A and 1B illustrate a semiconductor device including a backside contact structure formed based on a placeholder structure, according to one or more embodiments.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "1$^{st}$" element or a "2$^{nd}$" element, respectively, as long as their structural relationship is clearly understood in the context of the descriptions. Similarly, the terms a "lower" element and an "upper" element may be respectively referred to as a "1$^{st}$" element and a "2$^{nd}$" element with necessary descriptions to distinguish the two elements.

It will be understood that, although the terms "1$^{st}$," "2$^{nd}$," "3$^{rd}$," "4$^{th}$," "5$^{th}$," "6$^{th}$," etc. may be used herein to describe various elements, these elements should not be limited by these terms. These terms are only used to distinguish one element from another element. For example, a first element described in descriptions of embodiments could be termed a second element in one set of claims and a first element in another set of claims, without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension. Further, when a term "coplanar" or "aligned" is used to compare a positional relationship between two or more elements, the term may also cover "a substantially coplanar" or "substantially alighted" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity. Thus, it is to be understood that such schematic illustrations may not reflect actual images when any of the structures described herein are examined through scanning electron microscopy (SEM), transmission electron microscopy (TEM), focused ion beam (FIB) microscopy, etc.

For the sake of brevity, conventional elements, structures or layers of semiconductor devices including a nanosheet transistor, a fin field-effect transistor, and materials forming the same may or may not be described in detail herein. For example, a certain isolation layer, a buffer layer or a spacer structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments.

Figure 1B:
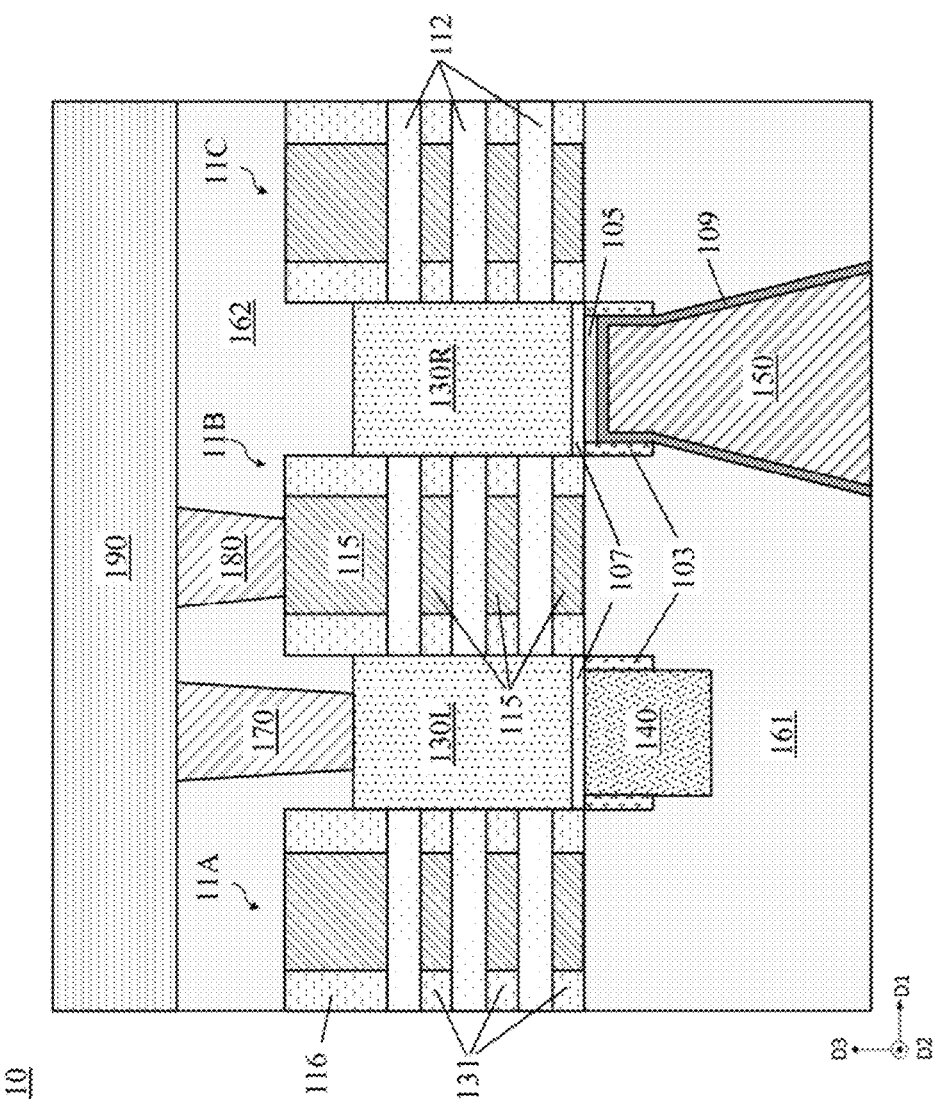

FIGS. 1A and 1B illustrate a semiconductor device including a backside contact structure formed based on a placeholder structure, according to one or more embodiments.

FIG. 1A is a simplified top plan view of a semiconductor device 10, and FIG. 1B illustrates a cross-section view of the semiconductor device 10 of FIG. 1A along a line I-I' shown therein in a D1 direction, according to one or more embodiments.

It is to be understood here that FIG. 1A is provided to show a positional relationship between source/drain regions and a gate structure of the semiconductor device 10, and thus, this top plan view does not show some structural elements of the semiconductor device 10 such as an isolation structure, metal lines, and contact structures as well as a channel structure surrounded by a gate structure. It is to be further understood that the D1 direction is a channel-length direction intersecting a D2 direction, which is a channel-width direction or a cell-height direction, and a D3 direction is a vertical direction intersecting the D1 direction and the D2 direction. The channel-length direction refers to a direction in which a current flows between two source/drain regions connection by a channel structure.

Referring to FIGS. 1A and 1B, the semiconductor device 10 may include first to third channel stacks 11A-11C each of which includes a plurality of channel layers 112 vertically stacked on a front side of the semiconductor device 10 and surrounded by a gate structure 115. Each of the channel layers 112 may be referred to as a nanosheet or nanoribbon extended in the D1 direction.

The channel layers 112 of each of the channel stacks 11A-11C surrounded by the gate structure 115 may form a channel structure which connects source/drain regions formed at both sides of the channel structure to form a field-effect nanosheet transistor. For example, a field-effect nanosheet transistor may be formed by a channel structure including the channel layers 112, the gate structure 115 surrounding the channel structure, and a first source/drain region 130L and a second source/drain region 130R connected by the channel layers 112 of the second channel stack 11B.

One or more materials forming the channel layers 112 may include, for example, silicon (Si), silicon germanium (SiGe). The gate structure 115 may be formed of one or more materials including, for example, copper (Cu), aluminum (Al), cobalt (Co), tungsten (W), titanium (Ti), tantalum (Ta) or their combination. Each of the source/drain regions 130L and 130R may include one or more materials, for example, silicon (Si), silicon germanium (SiGe) doped with impurities. The source/drain regions 130L and 130R may be either a p-type or an n-type.

Each of the channel stacks 11A-11C may also include inner spacers 131 formed at side surfaces of lower portions of the gate structure 115 respectively below the channel layers 112 in the D3 direction. Gate spacers 116 may be formed at side surfaces of an upper portion of the gate structure 115 in each of the channel stacks 11A-11C. The inner spacers 131 may isolate the lower portions of the gate structure 115 from the source/drain regions 130L and 130R, and the gate spacers 116 may isolate the upper portion of the gate structure 115 from the source/drain regions 130L and 130R. One or more materials forming the inner spacers 131 and the gate spacers 116 may include, for example, silicon nitride (e.g., SiN, $Si_3N_4$) or silicon oxide (e.g., $SiO_2$), not being limited thereto. The inner spacers 131 and the gate spacers 116 may be formed of the same or different materials.

The semiconductor device 10 may also include a plurality of contact structures including a frontside contact structure 170, a gate contact structure 180, and a backside contact structure 150. The frontside contact structure 170 may be formed on a top surface of the first source/drain region 130L to connect this source/drain region to a voltage source or another circuit element through a back-end-of-line (BEOL) structure 190 including one or more metal lines and vias. The gate contact structure 180 may be formed on a top surface of the gate structure 115 to receive a gate input signal for the gate structure 115 through the BEOL structure 190. The frontside contact structure 170 and the gate contact structure 180 may be isolated from each other through a frontside isolation structure 162. The backside contact structure 150 may be formed on a bottom surface of the second source/drain region 130R to connect this source/drain region to a voltage source or another circuit element. The backside contact structure 150 may be isolated from another circuit element by a backside isolation structure 161. The contact structures 170, 180 and 150 may each be formed of one or more metal such as copper (Cu), aluminum (Al), tungsten (W), ruthenium (Ru), molybdenum (Mo), etc. or a metal composition. The frontside isolation structure 162 and the backside isolation structure 161 may each be formed of a low-k dielectric material such as silicon oxide (e.g., $SiO_2$, etc.).

Further, the semiconductor device 10 may include a placeholder structure 140 formed below the first source/drain region 130L. This placeholder structure 140 may have been epitaxially grown from a silicon substrate which is replaced by the backside isolation structure 161. The placeholder structure 140 may be formed to provide a space for forming a backside contact structure therein in a process of manufacturing the semiconductor device 10. There also may have been another placeholder structure below the second source/drain region 130R which was removed and replaced by the backside contact structure 150. Unlike this removed placeholder structure, the placeholder structure 140 below the first source/drain region 130L may have remained there without being replaced by a backside contact structure because the frontside contact structure 170 is formed on the first source/drain region 130L to connect the first source/drain region 130L to a voltage source or another circuit element through the BEOL structure 190. The placeholder structure 140 may be formed of a material such as silicon germanium (SiGe), not being limited thereto.

Figure 3A:
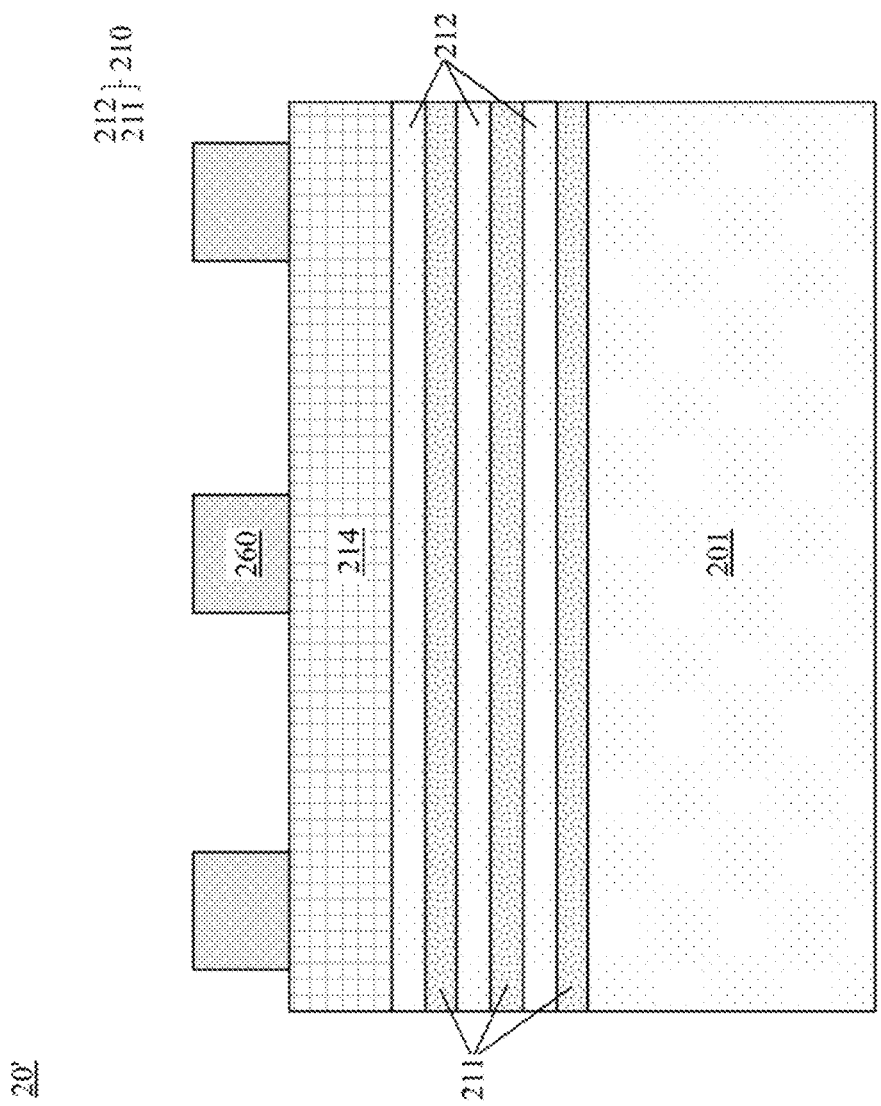
FIGS. 3A-3Q illustrate intermediate semiconductor devices obtained after respective steps of manufacturing a semiconductor device including a backside contact structure with a silicide layer formed in an FEOL process, according to one or more embodiments.
Figure 3B:
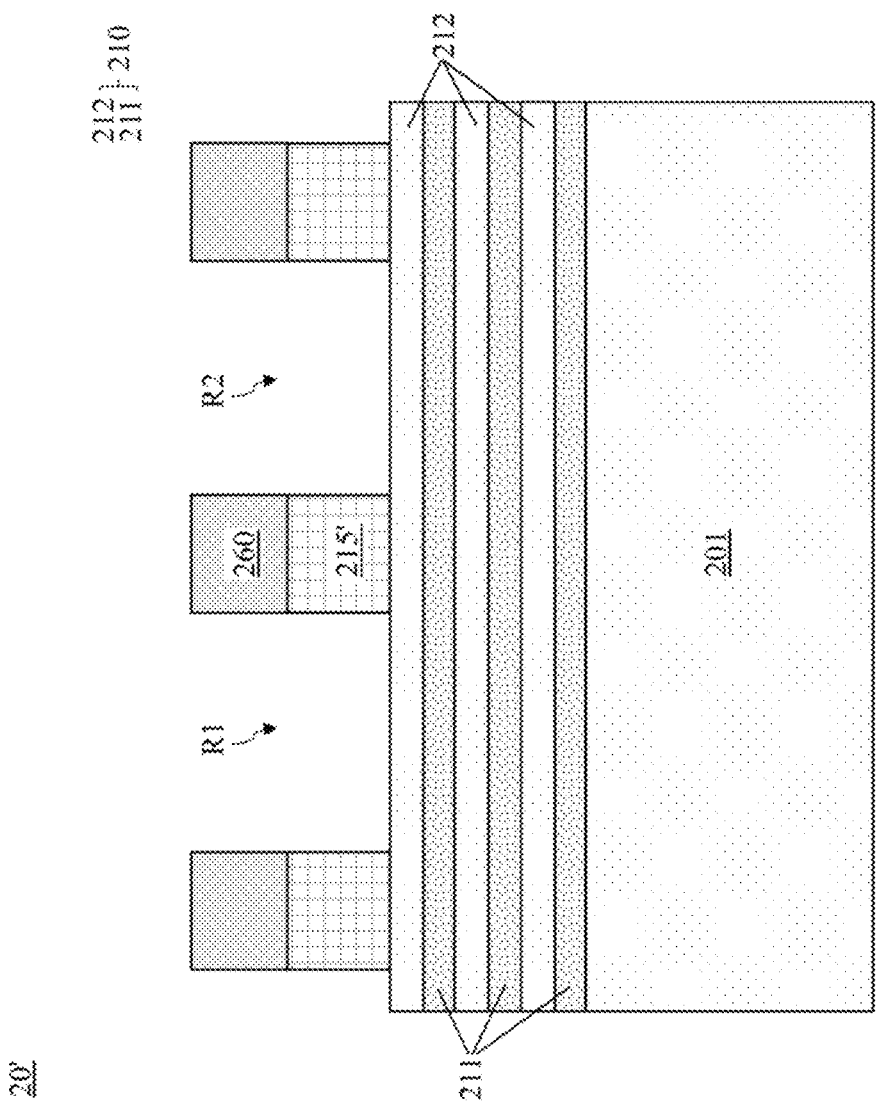
Figure 3C:
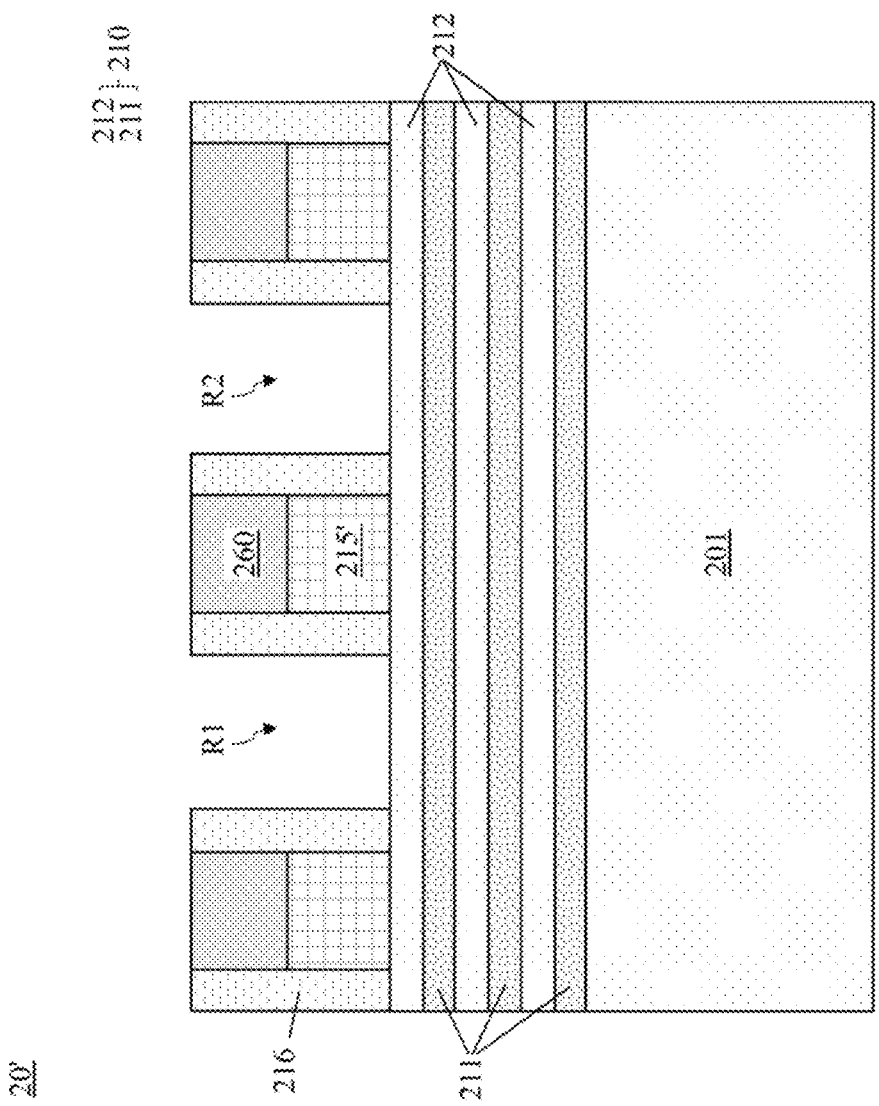
Figure 3F:
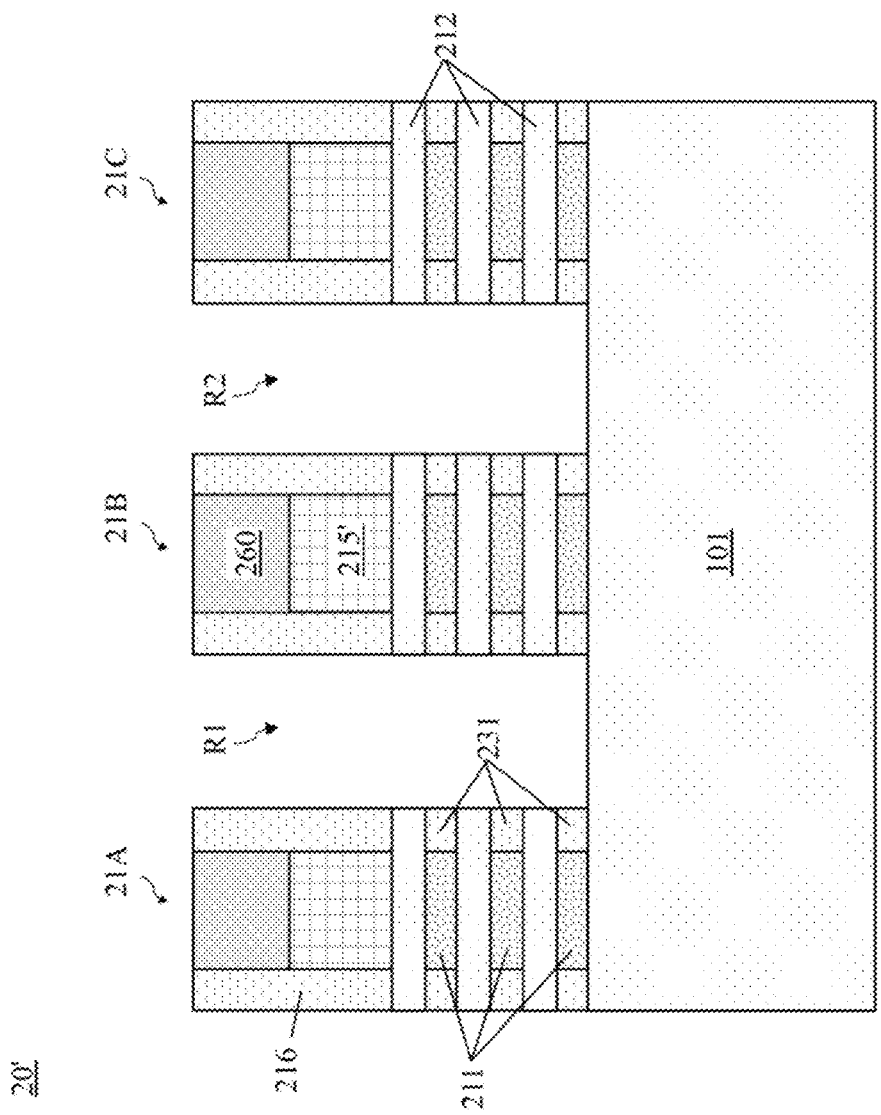
Figure 3G:
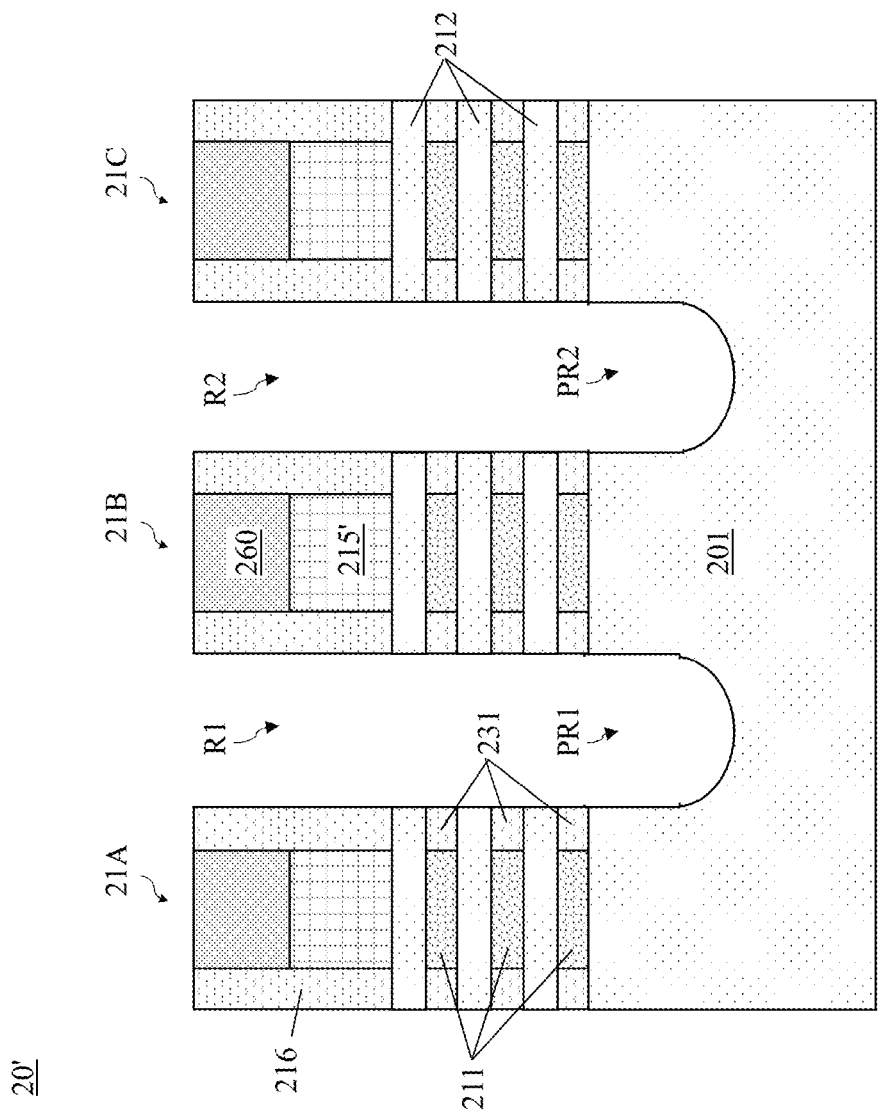
Figure 3H:
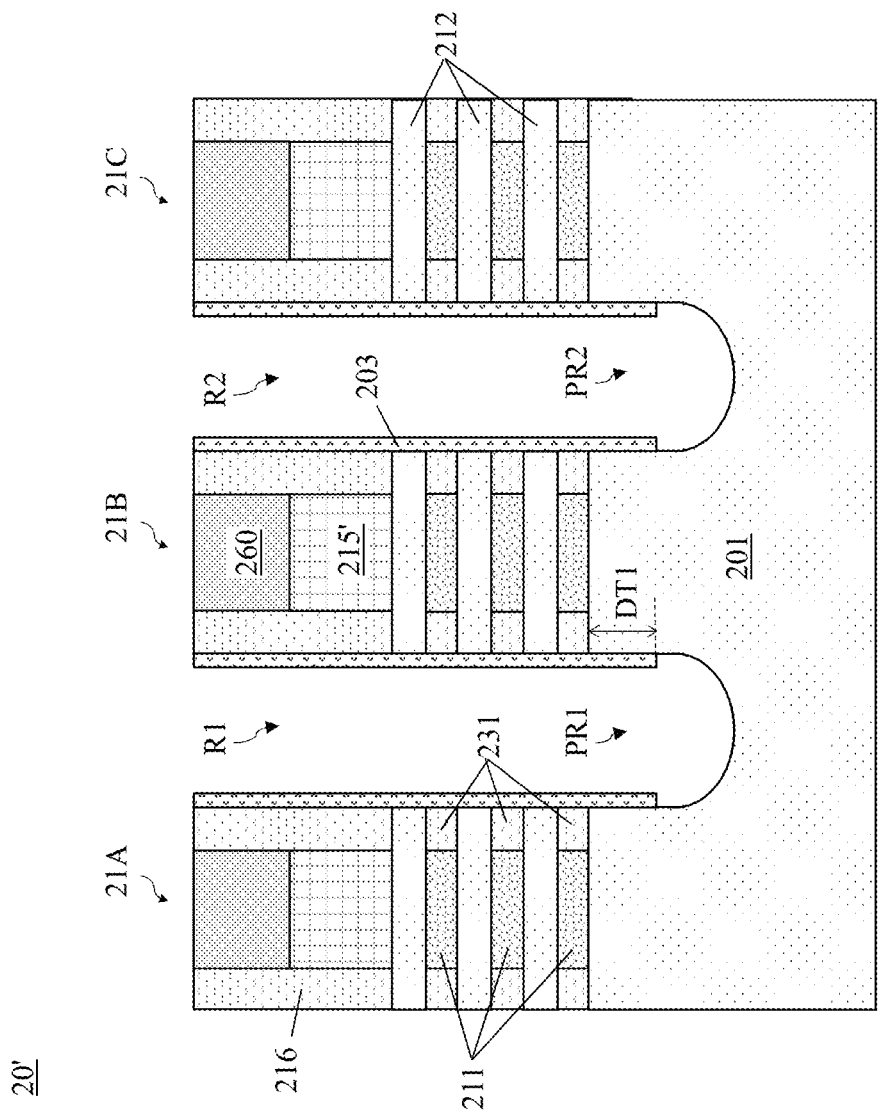
Figure 3I:
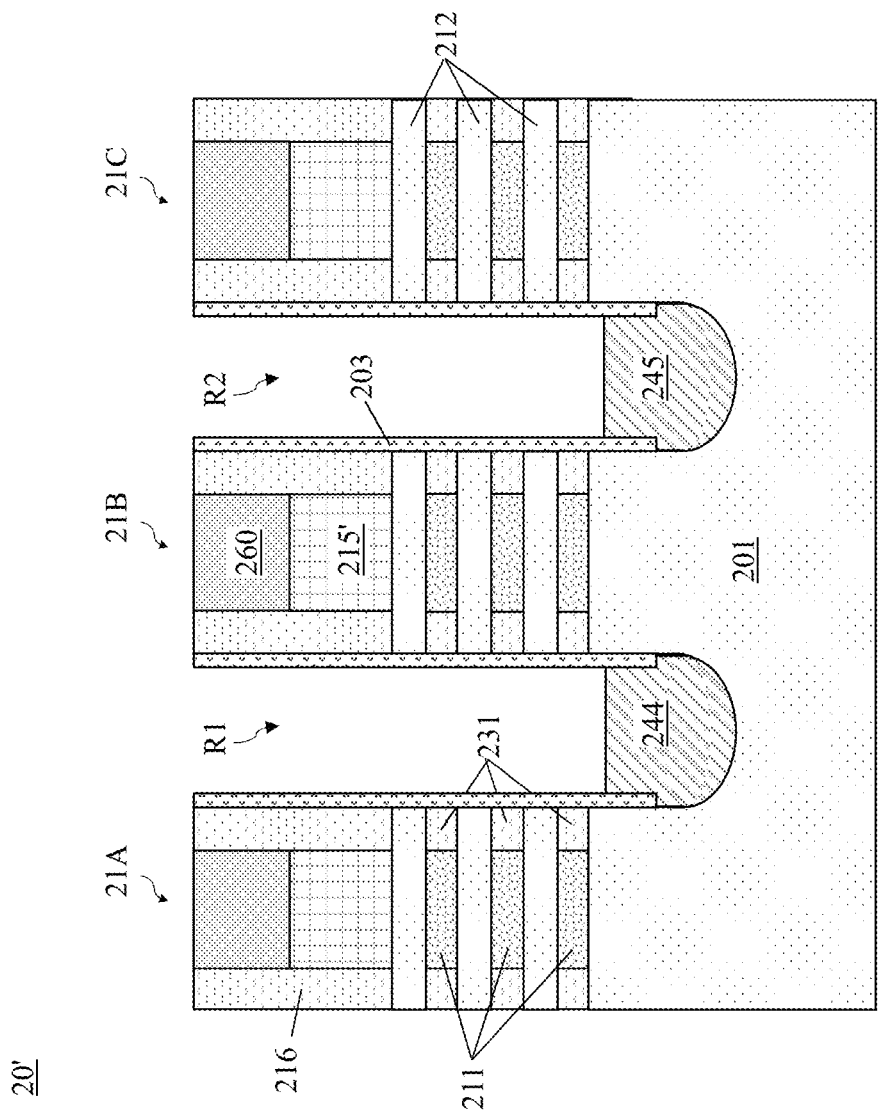
Figure 3J:
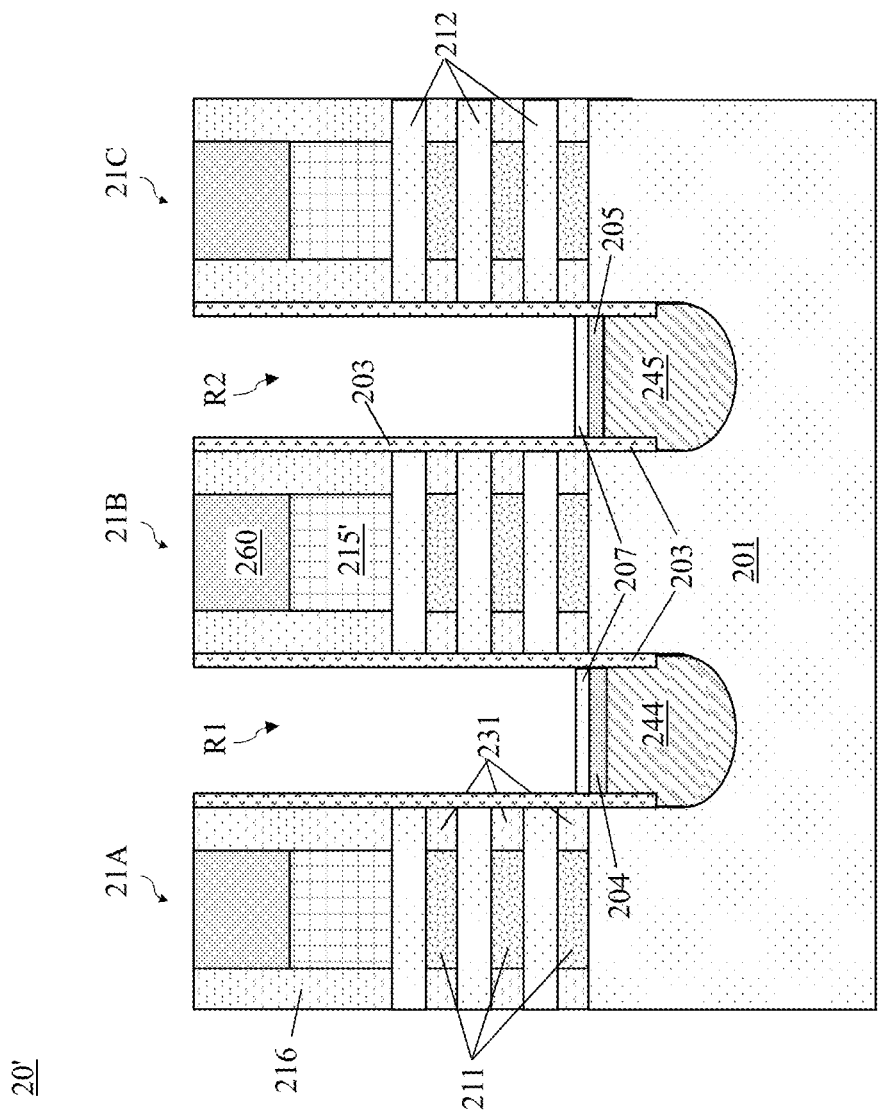
Figure 3L:
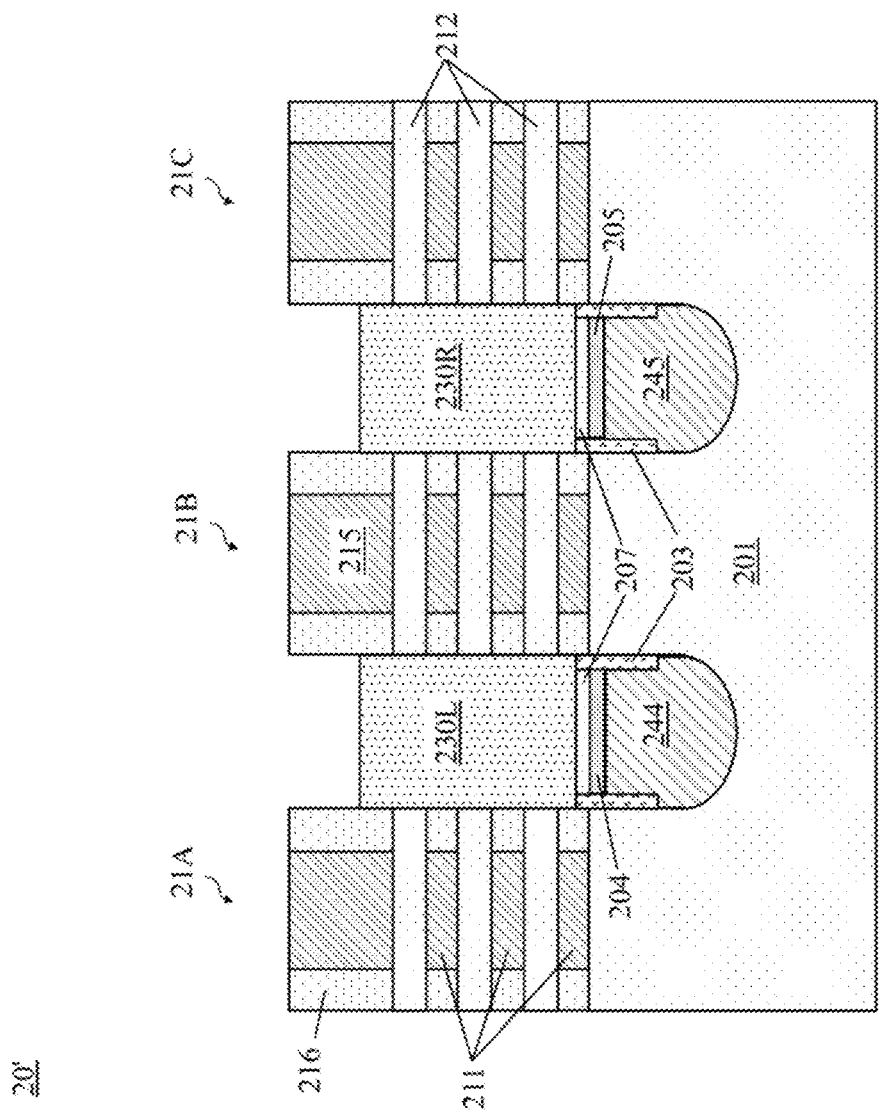
Figure 3M:
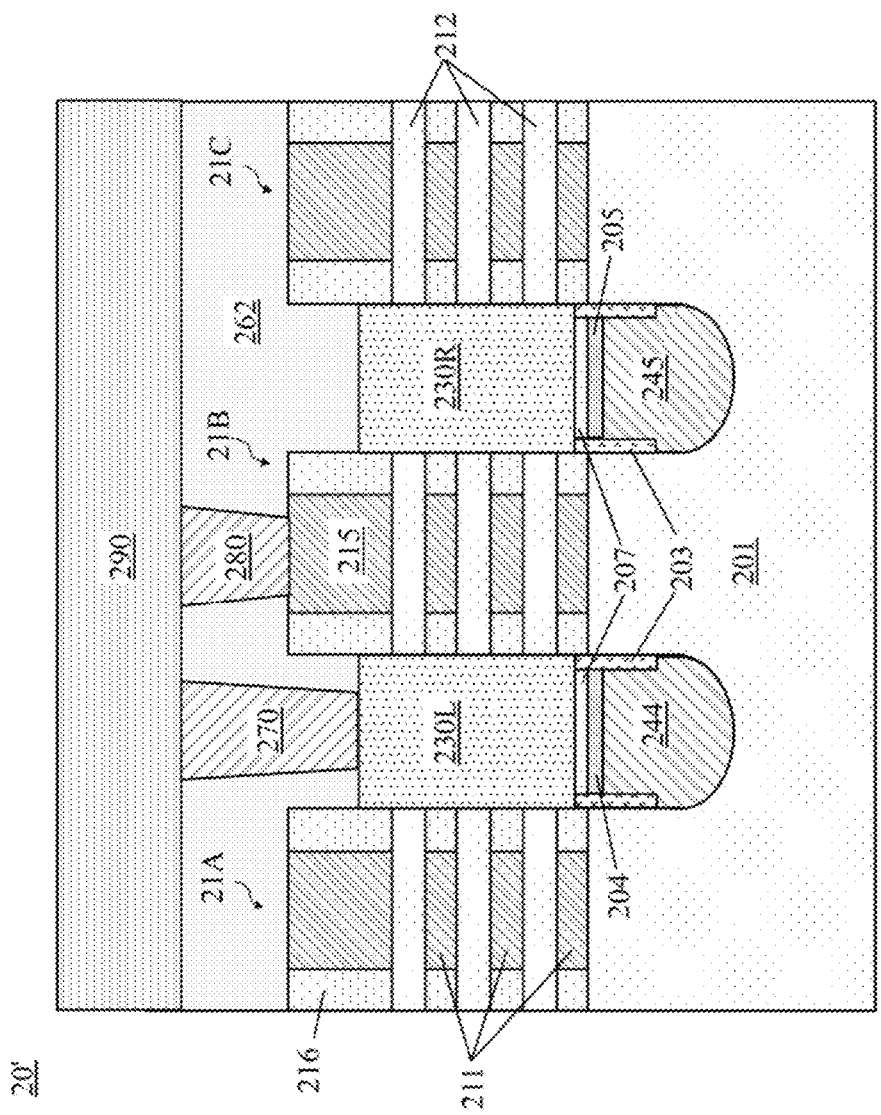
Figure 3N:
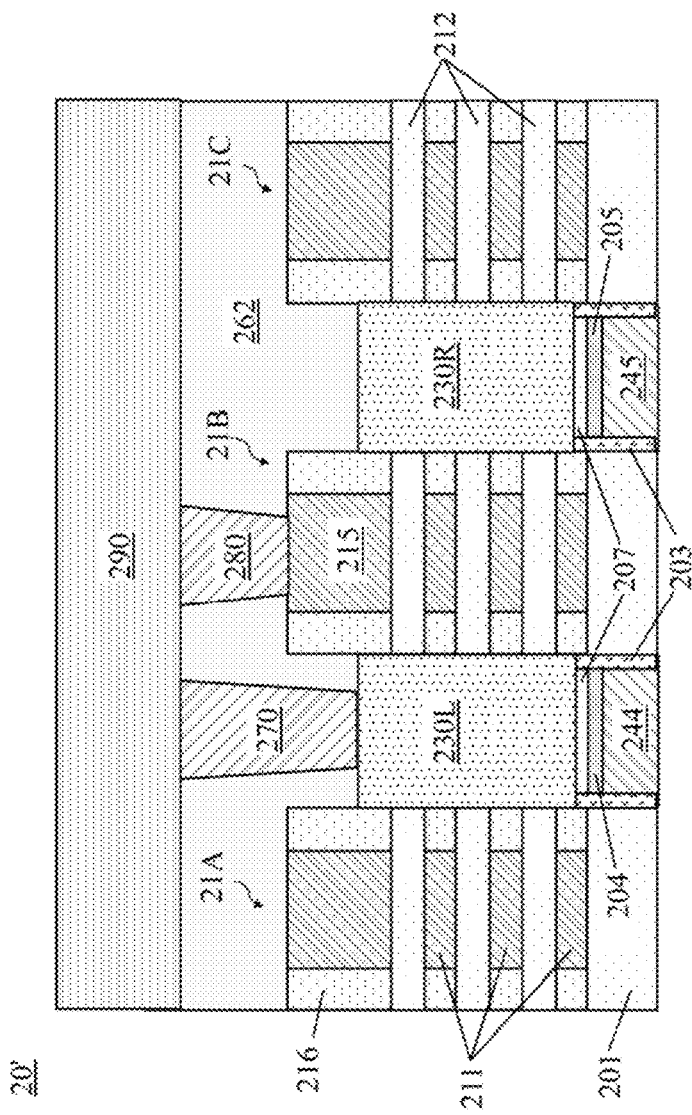
Figure 3O:
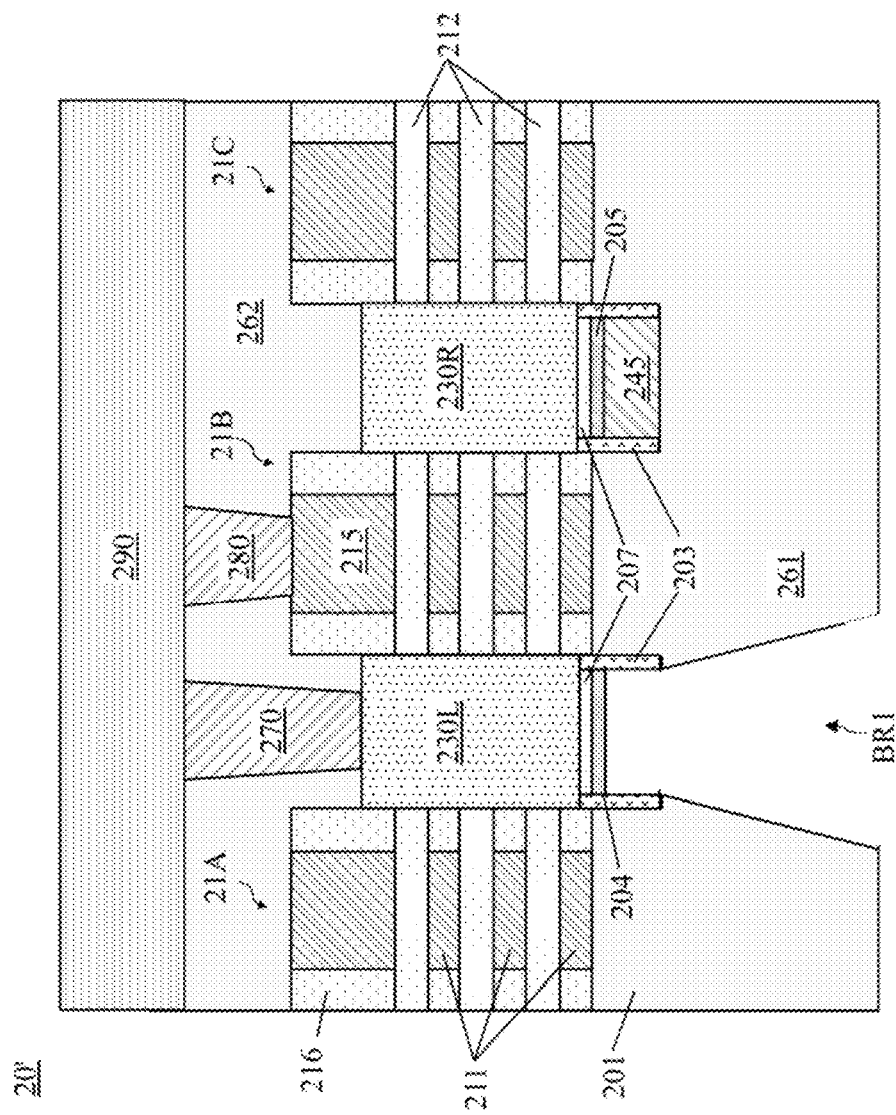
Figure 3P:
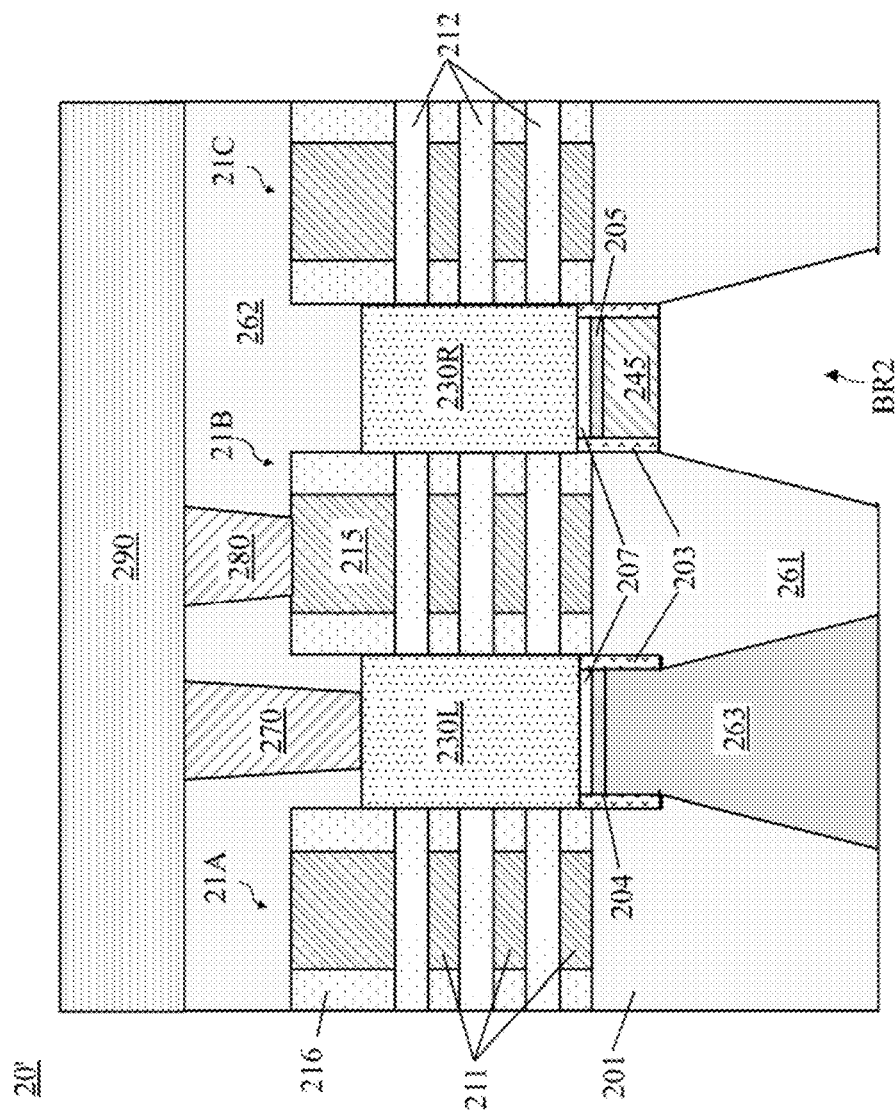
Figure 3Q:
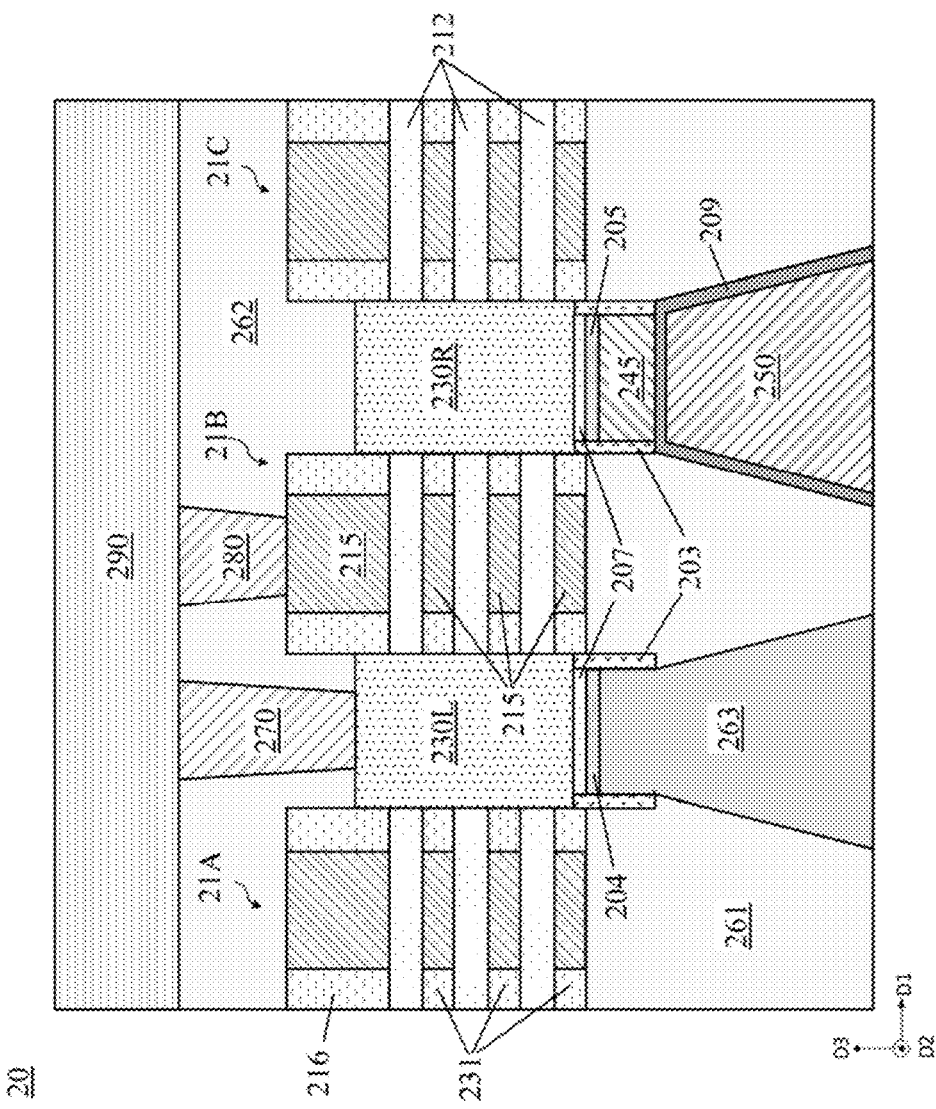

The placeholder structure 140 and the backside contact structure 150 may be formed in and surrounded by the backside isolation structure 161 which may have replaced a substrate 101 formed of silicon (Si), not being limited thereto, in the process of manufacturing the semiconductor device 10 (see FIGS. 3A-3Q).

A protection liner 103 may be formed between an upper portion of the placeholder structure 140 and the backside isolation structure 161. The protection liner 103 is originally formed also on side surfaces of the channel layers 112, the inner spacers 131 and the gate spacers 116 facing the source/drain regions 130L and 130R to protect these structural elements from various operations forming the placeholder structure 140. However, this original protection liner 103 may be partially removed thereafter to expose the side surfaces of the channel layer 112 so that the source/drain regions 130L and 130R can be epitaxially grown from the channel layers 112. Thus, the protection liner 103 may also be formed between an upper portion of the backside contact structure 150 and the backside isolation structure 161 with a barrier metal liner 109 therebetween. The protection liner 103 may be formed of silicon nitride or a composite thereof (e.g., SiN, $Si_3N_4$, SiBCN, SiCN, etc.), not being limited thereto The barrier metal liner 109 may be formed on a side surface and a top surface of the backside contact structure 150 to prevent electromigration of metal atoms (e.g., Cu, W, Al, etc.) of the backside contact structure 150 into the backside isolation structure 161 of a low-k material such as silicon oxide (e.g., $SiO_2$, etc.). The barrier metal liner 109 may also facilitate adhesion of the backside contact structure 150 to the backside isolation structure 161. For these purposes, the barrier metal liner 109 may be formed of metal nitride such as titanium nitride (TIN), tantalum nitride (TaN), tungsten nitride (WN), nickel nitride (NiN), cobalt nitride (CON), or platinum nitride (PtN), not being limited thereto. However, according to one or more other embodiments, the barrier metal liner 109 may not be formed between the backside contact structure 150 and the backside isolation structure 161 when the backside contact structure 150 is formed of a material such as ruthenium (Ru) or molybdenum (Mo) which has a low electromigration property in the low-k material. The same barrier metal liner may be formed on outer surfaces of the frontside contact structure 170 and the gate contact structure 180 for the same purposes.

A buffer layer 107 may be optionally formed on bottom surfaces of the source/drain regions 130L and 130R to protect these source/drain regions when the placeholder structures are removed by an etching operation (e.g. wet etching) and replaced by the backside contact structures including the backside contact structure 150. The buffer layer 107 may have the same material or material composition of the source/drain regions 130L and 130R.

A silicide layer 105 may be formed between the second source/drain region 130R (or the buffer layer 107) and a combination of the backside contact structure 150 and the barrier metal liner 109. The silicide layer 105 may facilitate an interface for current flow between the second source/drain region 130R formed of a semiconductor material (e.g., Si or SiGe) and the combination of the backside contact structure 150 and the barrier metal liner 109, both formed of a metal (Cu, W, Co, Ti, Ta, etc.), by reducing contact resistance therebetween. The silicide layer 105 may also improve adhesion of the backside contact structure 150 to the second source/drain region 130R (or the buffer layer 107).

The silicide layer 105 may be formed by depositing a thin metal layer such as Ti, Co, and/or nickel (Ni), not being limited thereto, on the bottom surface of the second source/drain region 130R (or the buffer layer 107 if any) and annealing the thin metal layer, thereby to form a silicide layer including nickel silicide (NiSi), cobalt silicide (CoSi), titanium silicide ($TiSi_2$), or so on. The same silicide layer may be formed on a top surface of the first source/drain region 130L below the frontside contact structure 170.

However, when the semiconductor device 10 is manufactured, the formation of the silicide layer 105 on the back side of the semiconductor device 10 may be performed in a BEOL process after forming the BEOL structure 190 including metal lines and vias formed of a metal such as Cu, Al, W, etc. Thus, the annealing temperature for the silicidation may not exceed 400-500° C. which may be a melting temperature of the metal forming the BEOL structure 190. Thus, there is a limit in obtaining a high-quality silicide layer which requires intermixing silicon and metal at a higher temperature such as about 900° C. or above.

The following embodiments provide a semiconductor device including a backside contact structure in which a silicide layer is formed at a higher temperature in a front-end-of-line (FEOL) process prior to a BEOL process in which a BEOL structure is formed.

FIG. 2 illustrates a semiconductor device including a backside contact structure with a silicide layer formed in an FEOL process, according to one or more embodiments.

Referring to FIG. 2, a semiconductor device 20 may include the same or similar structural elements of the semiconductor device 10 of FIGS. 1A and 1B except backside structures such as a backside contact structure and a placeholder structure. The semiconductor device 20 may include first to third channel stacks 21A-21C, channel layers 212, first and second source/drain region 230L and 230R, a buffer layer 207, a gate structure 215, inner spacers 231, gate spacers 216, a frontside contact structure 270, a gate structure 280, a BEOL structure 290, a backside isolation structure 261, a protection liner 203, and a frontside isolation structure 262, which may be the same as or similar to the corresponding structural elements of the semiconductor device 10. Thus, duplicate descriptions of these structural elements may be omitted for brevity purposes while different aspects of the semiconductor device 20 are described herebelow.

In the semiconductor device 20, a supplemental isolation structure 263 may be formed below a bottom surface of the first source/drain region 230L in a backside isolation structure 261 which is formed of the same low-k material of the frontside isolation structure 162 of the semiconductor device 10. Further, a first silicide layer 204 may be formed on a top surface of the supplemental isolation structure 263 below the buffer layer 207 on a bottom surface of a first source/drain region 230L.

Moreover, a metal placeholder structure 245 may be formed between a backside contact structure 250 and the second source/drain region 230L. A barrier metal liner 209 may be formed on a top surface and a side surface of the backside contact structure 250, similar to the barrier metal liner 109 of the semiconductor device 10. However, unlike in the semiconductor device 10, a portion of the barrier metal liner 209 on the top surface of the backside contact structure 250 does not contact a second silicide layer 205 formed below a bottom surface of the second source/drain region 230R, and instead, may contact another metal structure which is a metal placeholder structure 245. The barrier metal liner 209 may be formed of the same or similar material forming the barrier metal liner 109 of the semiconductor device 10.

Another metal placeholder structure similar to the metal placeholder structure 245 may also have been formed below the first source/drain region 230L when the metal placeholder structure 245 is formed. However, this metal placeholder structure below the first source/drain region 230L may have been removed and replaced by the supplemental isolation structure 263 because this metal placeholder structure, if not replaced by a backside contact structure and remains below the first source/drain region 230L, may only increase contact capacitance of the semiconductor device 20. The supplemental isolation structure 263 may be formed of a low-k dielectric material such as silicon oxide or silicon nitride (e.g., $SiO_2$, SiN, etc.), which may be the same as or different from the material forming the backside isolation structure 261. However, as will be described later, the supplemental isolation structure 263 may be formed by etching the backside isolation structure 261, and thus, an interface, a barrier or a connection surface may be formed between these two isolation structures even if they may be formed of the same dielectric material.

As will also be described later, the metal placeholder structures including the metal placeholder structure 245 formed below the source/drain regions 230L and 230R may have been used to form the silicide layers 204 and 205 at an FEOL process before a BEOL process in which the BEOL structure 290 including one or more metal lines and/or vias is formed. Thus, the silicide layers 204 and 205, unlike the silicide layer 105 of the semiconductor device 10 formed in the BEOL process, may be formed by annealing at a higher temperature, e.g., on or above 900° C. without a concern of melting of the BEOL structure 290. After forming the silicide layers 204 and 205, the metal placeholder structure below the first silicide layer 204 may have been removed while the meal placeholder structure 245 below the second silicide layer 205 may remain, and the backside contact structure 250 with the barrier metal liner 209 may be formed thereon. As described above, the metal placeholder structure formed below the first source/drain region 230L may have been removed to remove unnecessary generation of capacitance, while the metal placeholder structure 245 may connect the backside contact structure 250 to the second source/drain region 230R through the second silicide layer 205 and the buffer layer 207 if any.

The silicide layers 204 and 205 may be formed of the same material forming the silicide layer 105 of the semiconductor device 10, for example, nickel silicide (NiSi), cobalt silicide (CoSi), titanium silicide (TiSi$_2$), not being limited thereto.

Thus, the semiconductor device 20 may have the second silicide layer 205 having a higher quality formed at a higher temperature, thereby to achieve an improved connection performance, compared to the semiconductor device 10 having the silicide layer 105 formed at a lower temperature. Further, the semiconductor device 20 may also have the first silicide layer 204 below the first source/drain region 230L which is not connected to a backside contact structure.

Herebelow, a method of manufacturing the semiconductor device 20 including a backside contact structure with a silicide layer formed in an FEOL process is provided.

FIGS. 3A-3Q illustrate intermediate semiconductor devices obtained after respective steps of manufacturing a semiconductor device including a backside contact structure with a silicide layer formed in an FEOL process, according to one or more embodiments. As the semiconductor device manufactured through the respective steps may be the same as or correspond to the semiconductor device 20 shown in FIG. 2, duplicate descriptions thereof may be omitted and the same reference numbers may be used in the descriptions herebelow.

Referring to FIG. 3A, an intermediate semiconductor device 20' may include a substrate 201 on which an initial channel stack 210, an initial dummy gate structure 214 and three hard mask patterns 260 are formed in this order.

The initial channel stack 210 may include a plurality of sacrificial layers 211 and channel layers 212 epitaxially grown one after another to be stacked on the substrate 201. The sacrificial layers 211 may each be formed of silicon germanium (SiGe), and the channel layers 212 may include silicon (Si) or SiGe. The sacrificial layers 211 are termed as such as these layers are formed therein to support formation of other structure elements of the semiconductor device 20 (FIG. 2) to be manufactured from the intermediate semiconductor device 20' and will be removed and replaced by a gate structure in a later step (FIG. 3L) in a process of manufacturing the semiconductor device 20.

The initial dummy gate structure 214 may be formed on the uppermost channel layer 212 and planarized through, for example, chemical mechanical polishing (CMP), not being limited thereto. The hard mask patterns 260 may be formed on the initial dummy gate structure 214 at positions where dummy gate structures for the first to third channel stacks 21A-21C shown in FIG. 2 are to be respectively patterned out therebelow in a next step (FIG. 3B). The initial dummy gate structure 214 may be formed of a material such as polycrystalline silicon or amorphous silicon, and the hard mask patterns 260 may be formed of a material such as silicon nitride or a composite thereof (e.g., SiN, Si$_3$N$_4$, SiBCN, SiNC, SiNOC, etc.).

Referring to FIG. 3B, the initial dummy gate structure 214' may be patterned to form three dummy gate structures 215' based on the hard mask patterns 260.

The formation of the three dummy gate structures 215' may be performed through, for example, dry etching such as reactive ion etching (RIE) based on the hard mask patterns 260. When the dummy gate structures 215' are formed based on the hard mask patterns 260, a top surface of the initial channel stack 210, for example, a top surface of the uppermost channel layer 212, may be exposed through a first recess R1 and a second recess R2.

Referring to FIG. 3C, gate spacers 216 may be formed on side surfaces of each dummy gate structure 215' with the hard mask pattern 260 thereon.

The formation of the gate spacers 216 may be performed through, for example, atomic layer deposition (ALD), chemical vapor deposition (CVD), plasma enhanced CVD (PECVD), physical vapor deposition (PVD), or a combination thereof, not being limited thereto. To form the gate spacers 215, a material such as silicon nitride (e.g., SiN, Si$_3$N$_4$) or silicon oxide (e.g., SiO$_2$), not being limited thereto, may be deposited on the entire intermediate semiconductor device 20' obtained in the previous step (FIG. 3B), and etched back to leave the gate spacer material only on the side surfaces of each dummy gate structure 215' with the hard mask pattern 260 thereon.

Referring to FIG. 3D, the initial channel stack 210 may be etched back through the recesses R1 and R2 based on the hard mask patterns 260 and the gate spacers 216 to form first to third channel stacks 21A-21C exposing a top surface of the substrate 201 therebetween.

By the etch back of the initial channel stack 210, the first recess R1 and the second recess R2 may be extended down to expose the top surface of the substrate 201 and side surfaces of the channel layers 212 and the sacrificial layers 211, thereby forming three channel stacks 21A-21C divided by the recesses R1 and R2. The etch back operation in this step may be performed through, for example, dry etching, not being limited thereto.

Referring to FIG. 3E, side surfaces of each of the sacrificial layers 211 in each of the channel stacks 21A-21C may be recessed to provide spaces for forming inner spacers 231 therein in a next step (FIG. 3F).

The etching operation in this step may be performed through, for example, selective wet etching or dry etching, not being limited thereto, to remove only silicon germanium (SiGe) included in the sacrificial layers 211 against silicon (Si) included in the channel layers 212 and the substrate 201. For example, a mixture of hydrofluoric acid (HF) and nitric acid (HNO$_3$) may be used for the selective etching in this step.

Referring to FIG. 3F, inner spacers 231 may be formed at side surfaces of the recessed sacrificial layers 211.

Each of the inner spacer 231 may be formed such that side surfaces of the recessed sacrificial layer 211 exposed to the recesses R1 and R2 are vertically aligned with or coplanar with the side surfaces of the channel layers 212 and the gate spacers 216 also exposed to the recesses R1 and R2. The formation of the inner spacers 231 may be performed through, for example, atomic layer deposition (ALD) or any other suitable deposition process or electroplating.

The inner spacers 231 may be formed of a material such as silicon nitride (e.g., SiN, Si$_3$N$_4$) or silicon oxide (e.g., SiO$_2$), not being limited thereto, which may be the same as or different from that forming the gate spacers 216.

Referring to FIG. 3G, the substrate 201 of which the top surface is exposed through recesses R1 and R2 may be patterned to extend the recesses R1 and R2 below a level of the top surface of the substrate 201.

In this step, the substrate 201 exposed through the first recess R1 and the second recess R2 may be patterned through, for example, dry etching, not being limited thereto, based on the hard mask patterns 260 and the gate spacers 216 such that a first placeholder recess PR1 and a second placeholder recess PR2 are obtained in the substrate 201 below the level of the top surface of the substrate 201. The top surface of the substrate 201 may be horizontally coplanar or aligned with a bottom surface of the lowermost inner spacer 231 and a bottom surface of the lowermost sacrificial layer 211.

The placeholder recesses PR1 and PR2 may be connected to the recesses R1 and R2, respectively. In the recesses R1 and R2, source/drain regions will be formed, and placeholder structures will be formed in the placeholder recesses PR1 and PR2, in later steps.

Referring to FIG. 3H, a protection liner 203 may be formed along entire surfaces of the recesses R1 and R2 and the placeholder recesses PR1 and PR2, and partially removed below a depth DT1 from the level of the top surface of the substrate 201 in each of the placeholder recesses PR1 and PR2.

The protection liner 203 may be formed through, for example, depositing a material such as silicon nitride or a composite thereof (e.g., SiN, SiBCN, SiOCN, SiOC, etc.) on the entire surface of the recesses R1 and R2 and the placeholder recesses PR1 and PR2 through, for example, atomic layer deposition (ALD) and partially removing the deposited material below the depth DT1 from the level of the top surface of the substrate 101 in each of the placeholder recesses PR1 and PR2. Here, the entire surface of each of the recesses R1 and R2 may include the side surfaces of the gate spacer 216, the channel layers 212 and the sacrificial layers 211 exposed through the recesses R1 and R2.

The partial removal of the protection liner 203 in this step may include, for examine, dry etching based on masking the protection liner 203 except a portion below the depth DT1 in each of the placeholder recesses PR1 and PR2.

Referring to FIG. 3I, a selective metal growth is performed from a bottom surface of the placeholder recesses PR1 and PR2 such that first and second metal placeholder structures 244 and 245 may be formed in the placeholder recesses PR1 and PR2.

The selective metal growth may be performed by depositing a metal such as tungsten (W) or molybdenum (Mo) using a halide precursor through, for example, CVD, not being limited thereto, so that the metal placeholder structures can be grown from the silicon substrate 201 to the level of the top surface of the substrate 201.

Referring to FIG. 3J, silicidation may be performed on the top surface of the metal placeholder structure 244 and 245 based on a silicon source formed thereon so that first and second silicide layers 204 and 205 may be formed on the top surfaces of the first and second metal placeholder structures 244 and 245, respectively, at an annealing temperature of 900 or above.

At this time, a portion of the silicon source which is unreacted with the metal placeholder structure 244 and 245 for silicidation may remain on top surfaces of the silicide layers 204 and 205 to form buffer layers 207 for source/drain regions to be formed in a next step.

Referring to FIG. 3K, the protection liner 203 may be removed in part above a level of a top surface of the buffer layers 207 to expose the channel layers 212 through the recesses R1 and R2, and first and second source/drain regions 230L and 230R may be formed based on the channel layers 212 and the buffer layers 207.

At this time, a portion of the protection liner 203 may still remain on side surfaces of the buffer layers 207, the silicide layers 204 and 205, and an upper portion of each of the metal placeholder structures 244 and 245. The partial removal of the protection liner 103 in this step may also be performed through, for example, dry etching based on masking a portion of the protection liner 103 below the level of the top surface of the buffer layers 207 in each of the recesses R1 and R2.

The source/drain regions 230L may be epitaxially grown from the channel layers 212 of the first channel stack 21A and the second channel stack 21B in the first recess R1, and the second source/drain region 230R may be epitaxially grown from the channel layers 212 of the second channel stack 21B and the third channel stack 21C in the second recess R2, while the sacrificial layers 211 in each of the channel stacks 21A-21C are blocked by the inner spacers 231 to prevent or suppress epitaxy from the sacrificial layers 211 of silicon germanium (SiGe).

The source/drain regions 230L and 230R may be doped in-situ with p-type impurities (e.g., boron, gallium, or indium) or n-type impurities (e.g., phosphorus, arsenic, or antimony). Alternatively or additionally, the impurities may be injected into the source/drain regions 230L and 230R after the epitaxial growth thereof.

After formation of the source/drain regions 230L and 230R, bottom surfaces of the source/drain regions 230L and 230R may contact the top surfaces of the buffer layers 207. However, when the buffer layers 207 may not be formed after silicidation performed in the previous step, the bottom surfaces of the source/drain regions 230L and 230R may directly contact the top surface of the silicide layers 204 and 205, respectively.

Referring to FIG. 3L, the hard mask patterns 260 may be removed, and the dummy gate structure 215' and the sacrificial layers 211 may be removed and replaced by the gate structure 215.

After formation of the source/drain regions 230L and 230R, the hard mask patterns 260 on the dummy gate structures 215' and portions of the gate spacers 216 at side surfaces of the hard mask patterns 260 may be removed by, for example, dry etching including stripping or ashing, not being limited thereto.

The dummy gate structure 215' and the sacrificial layers 211 may be removed through, for example, wet etching and/or dry etching, to form voids or spaces in each of the channel stacks 21A-21C, and the gate structure 215 may be formed in these voids or spaces through, for example, CVD, PVD, PECVD, ALD, or a combination thereof, not being limited thereto.

Subsequent to the FEOL process performed until this step, a middle-of-line (MOL) process and an BEOL process begin from the next step.

Referring to FIG. 3M, a frontside isolation structure 262, an MOL structure including a frontside contact structure 270 and a gate contact structure 280, and a BEOL structure 290 including one or more metal lines and/or vias may be formed on the intermediate semiconductor device 20' obtained in the previous step (FIG. 3L).

The frontside isolation structure 262 may be formed on the intermediate semiconductor device 20' obtained in the previous step (FIG. 3L) including the source/drain regions 230L and 230R to isolate the source/drain regions 230L and 230R from each other and other circuit elements. The frontside isolation structure 262 may include silicon oxide (e.g., SiO$_2$, etc.). The formation of the frontside isolation structure 262 may be performed through, for example, PVD, CVD, PECVD, a combination thereof, not being limited thereto.

Subsequently, the frontside contact structure 270 and the gate contact structure 280 may be formed on top surfaces of the first source/drain region 230L and the gate structure 215, respectively, through the frontside isolation structure 262. The frontside contact structure 270 may connect the first source/drain region 230L to a voltage source or another circuit element. The gate contact structure 280 may receive a gate input signal for the gate structure 215. Here, a frontside contact structure may not be formed on a top surface of the second source/drain region 230R because a backside contact structure instead of the frontside contact structure may be formed in a later step (FIG. 3P) to connect the second source/drain region 230R to a voltage source or another circuit element.

In addition, the BEOL structure 290 may be formed on the frontside isolation structure 262 to connect the frontside contact structure 270 and the gate contact structure 280 to a voltage source or other circuit elements through one or more metal lines and/or vias formed therein. The formation of the BEOL structure 290 may include one or more damascene processes.

Referring to FIG. 3N, a lower portion of the substrate 201 and lower portions of the metal placeholder structure 244 and 245 may be planarized to a level of bottom surfaces of the protection liner 203. The planarization operation and the subsequent operations in the following steps may be performed through, for example, a CMP operations after flipping upside down the intermediate semiconductor device 20' obtained in the previous step (FIG. 3M).

Referring to FIG. 3O, the remaining portion of the substrate 201 may be removed and a backside isolation structure 261 may be formed to replace the original substrate 201. Further, the backside isolation structure 261 may be patterned below the first source/drain region 230L and the first metal placeholder structure 244 may be removed to form a first backside recess BR1 exposing the bottom surface of the first silicide layer 204 and side surfaces of the protection liner 203. The patterning and removal operations in this step may be performed through, for example, photolithography, masking, and etching operations.

Referring to FIG. 3P, the first backside recess BR1 may be filled in with a supplemental isolation structure 263 and a second backside recess BR2 may be formed to expose a bottom surface of the second metal placeholder structure 245 which is planarized in the previous step (FIG. 3N).

The formation of the supplemental isolation structure 263 in the first backside recess BR1 may be performed through, for example, CVD, PVD, PECVD, etc., not being limited thereto, such that a top surface of the supplemental isolation structure 263 contacts the bottom surface of the first silicide layer 204. As an upper portion of the supplemental isolation structure 263 is formed to replace the first metal placeholder structure 244 removed in the previous step (FIG. 3O), the upper portion of the supplemental isolation structure 263 may be formed on the side surfaces of the protection liner 203 below the first source/drain region 230L.

The supplemental isolation structure 263 may be formed of a low-k dielectric material such as silicon oxide or silicon nitride (e.g., SiO$_2$, SiN, etc.), which may be the same as or different from the material forming the backside isolation structure 261. However, the supplemental isolation structure 263 is formed in this step after the backside isolation structure 261 is formed in the previous step (FIG. 3O), an interface, a barrier or a connection surface may be formed between the two isolation structures.

The formation of the second backside recess BR2 may be performed through, for example, photolithography, masking, and etching operations such that the bottom surface of the second metal placeholder structure 245 which is planarized in the previous step (FIG. 3N) is exposed through the second backside recess BR2.

Referring to FIG. 3Q, a barrier metal liner 209 may be formed on an inner surface of the second backside recess BR2, and a backside contact structure 250 may be formed on the barrier metal liner 209.

The barrier metal liner 209 may be formed by depositing metal nitride such as TiN, TaN, WN, NiN, CON or PtN through, for example, ALD. However, as described earlier in reference to FIGS. 1A and 1B, the barrier metal liner 209 may not be formed between the backside contact structure 250 and the backside isolation structure 261 when the backside contact structure 150 is formed of a material such as ruthenium (Ru) or molybdenum (Mo) other than copper (Cu), tungsten (W), aluminum (Al), etc. This is because Ru or Mo is known to have a very low electromigration property in the low-k material forming the backside isolation structure 261. However, even when the barrier metal liner 209 is not formed between the backside contact structure 250 and the second metal placeholder structure 245, an interface, a barrier or a connection surface may be formed therebetween because these two metal structures are formed at different steps as described above, and/or may be formed from different materials. For example, the metal placeholder structure 245 may be formed of tungsten (W) or molybdenum (Mo), and the backside contact structure 250 may be formed of ruthenium (Ru).

Through the above method, a semiconductor device including a backside contact structure with a silicide layer formed at a higher temperature of 900 or above may be manufactured.

Figure 4A:
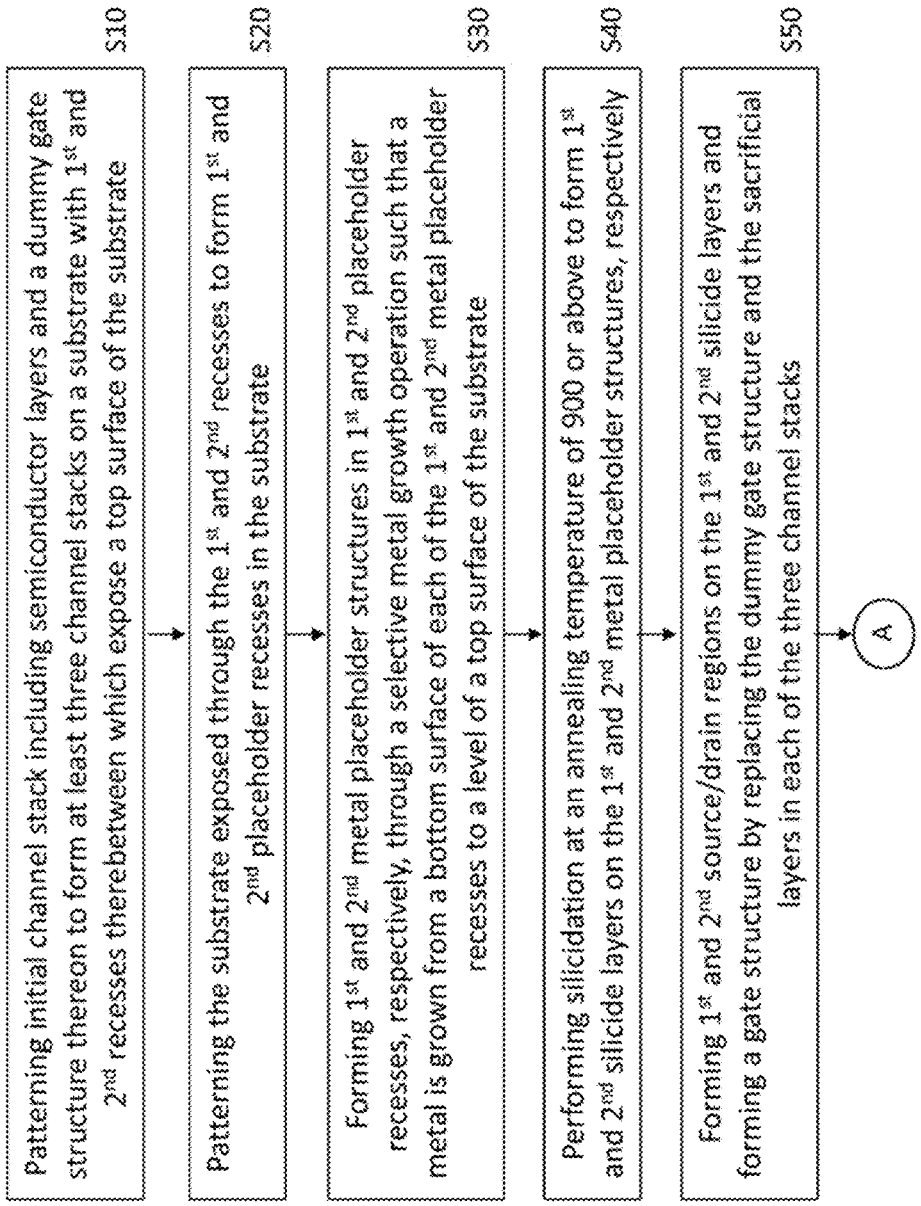
FIGS. 4A and 4B illustrate a flowchart describing a method of manufacturing a semiconductor device including a backside contact structure with a silicide layer formed in an FEOL process in reference to FIGS. 3A-3Q, according to one or more embodiments.
Figure 4B:
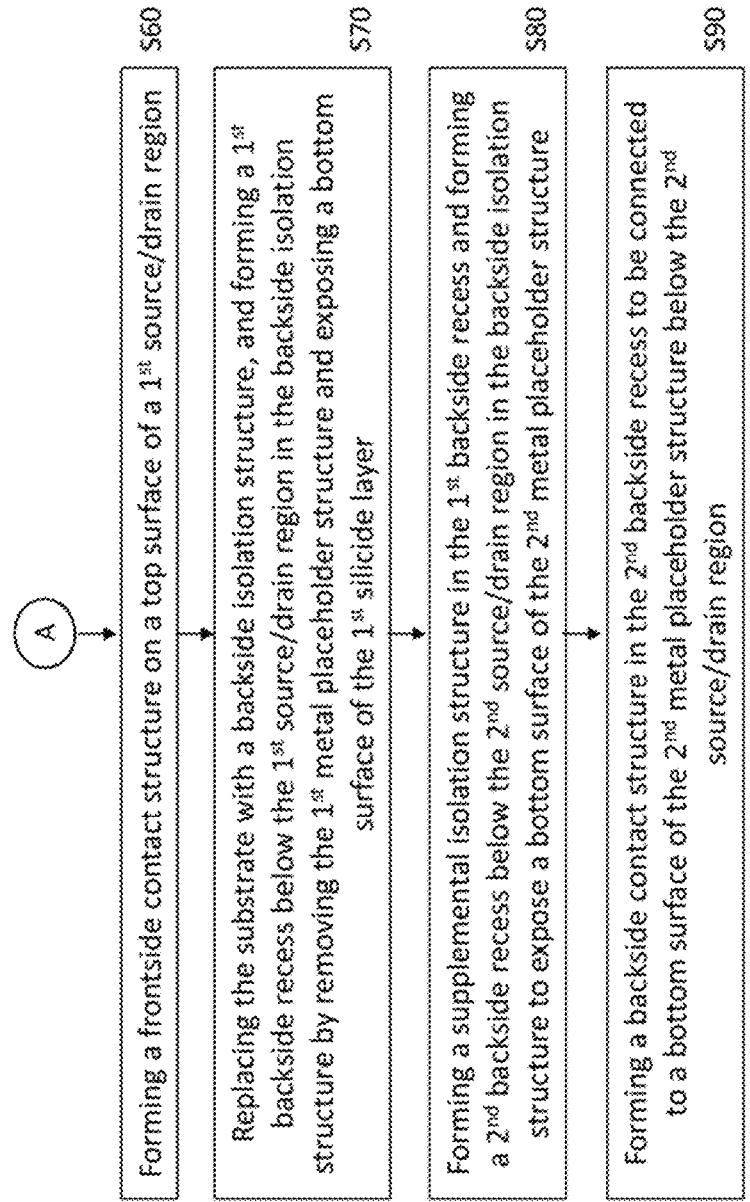

FIGS. 4A and 4B illustrate a flowchart describing a method of manufacturing a semiconductor device including a backside contact structure with a silicide layer formed in an FEOL process in reference to FIGS. 3A-3Q, according to one or more embodiments.

In step S10, an initial channel stack including a plurality of semiconductor layers and a dummy gate structure thereon may be patterned to form at least three channel stacks on a substrate with respective first and second recesses therebetween which expose a top surface of the substrate (FIGS. 3A-3D). The semiconductor layers in the initial channel stack may include a plurality of sacrificial layers and channel layers alternatively stacked one by one on the substrate. These semiconductor layers may be epitaxially grown from the substrate.

In step S20, the substrate exposed through the first and second recesses may be patterned from top to form first and second placeholder recesses in the substrate (FIGS. 3E-3G). At this time, the sacrificial layers in each channel stack may have been recessed at their side surfaces and inner spacers may be formed on the recessed sacrificial layers, respectively, while the channel layers are exposed to the recessed between the channel stacks.

In step S30, first and second metal placeholder structures may be formed in first and second placeholder recesses, respectively, through a selective metal growth operation such that a metal (e.g., W or Mo) is grown from a bottom surface of each of the first and second metal placeholder recesses to a level of a top surface of the substrate (FIGS. 3H-3I).

In step S40, silicidation may be performed on respective top surfaces of the first and second metal placeholder structures based a silicon source at an annealing temperature of 900 or above to form first and second silicide layers on the first and second metal placeholder structures, respectively (FIG. 3J).

In step S50, first and second source/drain regions may be formed on the first and second silicide layers based on the channel structures of the three channel stacks, and a gate structure may be formed by replacing the dummy gate structure and the sacrificial layers in each of the three channel stacks (FIGS. 3K-3L).

In step S60, a frontside contact structure may be formed on a top surface of a first source/drain region which will not be connected to a voltage source or another circuit element (FIG. 3M) though a backside contact structure to be formed in a later step.

In step S70, the substrate may be removed and replaced by a backside isolation structure, and a first backside recess may be formed below the first source/drain region in the backside isolation structure by removing the first metal placeholder structure and exposing a bottom surface of the first silicide layer (FIG. 3O).

In step S80, a supplemental isolation structure may be formed in the first backside recess and a second backside recess may be formed below the second source/drain region in the backside isolation structure to expose a bottom surface of the second metal placeholder structure (FIG. 3P).

In step S90, a backside contact structure may be formed in the second backside recess to be connected to a bottom surface of the second metal placeholder structure below the second source/drain region (FIG. 3Q).

FIG. 5 is a schematic block diagram illustrating an electronic device including a semiconductor device including a backside contact structure with a silicide layer formed in an FEOL process, according to one or more embodiments. This semiconductor device may be or correspond to the semiconductor device 20 shown in FIG. 2.

Referring to FIG. 5, an SoC 1000 may be an integrated circuit in which components of a computing system or other electronic systems are integrated. As an example of the SoC 1000, an application processor (AP) may include at least one processor and components for various functions. The SoC 1000 may include a core 1011 (e.g., a processor), a digital signal processor (DSP) 1012, a graphic processing unit (GPU) 1013, an embedded memory 1014, a communication interface 1015, and a memory interface 1016. The components of the SoC 1000 may communicate with each other through a bus 1007.

The core 1011 may process instructions and control operations of the components included in the SoC 1000. For example, the core 1011 may process a series of instructions to run an operating system and execute applications on the operating system. The DSP 1012 may generate useful data by processing digital signals (e.g., a digital signal provided from the communication interface 1015). The GPU 1013 may generate data for an image output by a display device from image data provided from the embedded memory 1014 or the memory interface 1016, or may encode the image data.

The embedded memory 1014 may store data necessary for the core 1011, the DSP 1012, and the GPU 1013 to operate. The communication interface 1015 may provide an interface for a communication network or one-to-one communication. The memory interface 1016 may provide an interface for an external memory of the SoC 1000, such as a dynamic random access memory (RAM) (DRAM), a flash memory, etc.

At least one of the core 1011, the DSP 1012, the GPU 1013, and/or the embedded memory 1014 may include the semiconductor device 20 shown in FIG. 2.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A semiconductor device comprising:
   a placeholder structure;
   a first silicide layer above a top surface of the placeholder structure along a first direction perpendicular to the top surface and a bottom surface of the placeholder structure;
   a first source/drain region above the first silicide layer along the first direction; and
   a backside contact structure below the bottom surface of the placeholder structure along the first direction,
   wherein the placeholder structure is between a bottom surface of the first silicide layer and a top surface of the backside contact structure along the first direction, and
   wherein each of the placeholder structure and the backside contact structure comprises a metal or a metal compound.

2. The semiconductor device of claim 1, wherein the placeholder structure comprises a first metal.

3. The semiconductor device of claim 2, wherein the backside contact structure comprises a second metal different from the first metal.

4. The semiconductor device of claim 1, wherein the first silicide layer comprises nickel silicide, cobalt silicide, or titanium silicide.

5. The semiconductor device of claim 1, further comprising a barrier metal liner on a side surface of the backside contact structure,
   wherein the barrier metal liner is not formed between a side surface of the placeholder structure and a backside isolation structure.

6. The semiconductor device of claim 1, wherein an interface, a barrier or a connection surface is formed between the placeholder structure and the backside contact structure.

7. The semiconductor device of claim 1, further comprising a backside isolation structure surrounding the backside contact structure and the placeholder structure.

8. The semiconductor device of claim 7, further comprising:
   a supplemental isolation structure in the backside isolation structure;
   a second silicide layer on a top surface of the supplemental isolation structure; and
   a second source/drain region on the second silicide layer.

9. The semiconductor device of claim 8, wherein an interface, a barrier or a connection surface is formed between the supplemental isolation structure and the backside isolation structure.

10. The semiconductor device of claim 8, wherein the backside isolation structure comprises a first insulating material, and
    wherein the supplemental isolation structure comprises the first insulating material or a second insulating material.

11. A semiconductor device comprising:
a source/drain region;
a silicide layer below a bottom surface of the source/drain region along a first direction perpendicular to the bottom surface and a bottom surface of the silicide layer;
a supplemental isolation structure below the bottom surface of the silicide layer along the first direction; and
a backside isolation structure surrounding the supplemental isolation structure,
wherein the silicide layer is between the bottom surface of the source/drain region and a top surface of the supplemental isolation structure along the first direction.

12. The semiconductor device of claim 11, further comprising a frontside contact structure on a top surface of the source/drain region.

13. The semiconductor device of claim 11, wherein an interface, a barrier or a connection surface is formed between the supplemental isolation structure and the backside isolation structure.

14. The semiconductor device of claim 11, wherein the backside isolation structure comprises a first insulating material, and the supplemental isolation structure comprises the first insulating material or a second insulating material.

* * * * *